United States Patent
Hu

(10) Patent No.: US 11,984,403 B2
(45) Date of Patent: May 14, 2024

(54) INTEGRATED SUBSTRATE STRUCTURE, REDISTRIBUTION STRUCTURE, AND MANUFACTURING METHOD THEREOF

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 1 day.

(21) Appl. No.: 17/024,676

(22) Filed: Sep. 17, 2020

(65) Prior Publication Data

US 2021/0151382 A1    May 20, 2021

Related U.S. Application Data

(60) Provisional application No. 62/935,641, filed on Nov. 15, 2019.

(51) Int. Cl.
*H01L 23/532* (2006.01)
*B23K 1/00* (2006.01)
(Continued)

(52) U.S. Cl.
CPC .......... *H01L 23/53242* (2013.01); *B23K 1/00* (2013.01); *H01L 21/4853* (2013.01);
(Continued)

(58) Field of Classification Search
CPC ......... H01L 24/13–14; H01L 23/49811; H01L 23/49816; H01L 2224/16155–16168;
(Continued)

(56) References Cited

U.S. PATENT DOCUMENTS

2012/0074579 A1   3/2012  Su et al.
2014/0182906 A1*  7/2014  Hu ................. H01L 23/49827
                                                         174/262
(Continued)

FOREIGN PATENT DOCUMENTS

CN      1152191     6/1997
CN    107123632    9/2017
(Continued)

OTHER PUBLICATIONS

Office Action of Taiwan Counterpart Application, dated Apr. 21, 2021, pp. 1-13.
(Continued)

*Primary Examiner* — Nicholas J Tobergte
*Assistant Examiner* — William Henry Anderson
(74) *Attorney, Agent, or Firm* — JCIPRNET

(57) ABSTRACT

An integrated substrate structure includes a redistribution film, a circuit substrate, and a plurality of conductive features. The redistribution film includes a fine redistribution circuitry, a circuit substrate is disposed over the redistribution film and includes a core layer and a coarse redistribution circuitry disposed in and on the core layer. The circuit substrate is thicker and more rigid than the redistribution film, and a layout density of the fine redistribution circuitry is denser than that of the coarse redistribution circuitry. The conductive features are interposed between the circuit substrate and the redistribution film to be connected to the fine redistribution circuitry and the coarse redistribution circuitry. A redistribution structure and manufacturing methods are also provided.

10 Claims, 39 Drawing Sheets

(51) Int. Cl.
*H01L 21/48* (2006.01)
*H01L 23/00* (2006.01)
*H01L 21/60* (2006.01)

(52) U.S. Cl.
CPC ........ *H01L 23/53228* (2013.01); *H01L 24/14* (2013.01); *H01L 2021/60135* (2013.01)

(58) Field of Classification Search
CPC ......... H01L 23/49822; H01L 23/49827; H01L 23/49833; H01L 23/5383; H01L 23/5385; H01L 2224/02311; H01L 2224/0231; H01L 21/76829; H01L 21/76832–76835; H01L 21/02304; H01L 21/76888; H01L 23/53238; H01L 2224/80896; H01L 2224/0557; H01L 2224/13009; H01L 2224/13025; H01L 2224/16146; H01L 2224/16165; H01L 2224/16235; H01L 2224/29025; H01L 2224/32146; H01L 2224/023–024; H01L 21/76852; H05K 1/112; H05K 1/113; H05K 2201/09481
See application file for complete search history.

(56) References Cited

U.S. PATENT DOCUMENTS

| | | |
|---|---|---|
| 2016/0064254 A1 | 3/2016 | Hu |
| 2016/0174365 A1 | 6/2016 | Lin et al. |
| 2017/0125348 A1* | 5/2017 | Hu ...................... H01L 23/5386 |
| 2019/0051621 A1* | 2/2019 | Liu ....................... H01L 21/563 |
| 2019/0067227 A1* | 2/2019 | Park ........................ H01L 24/19 |
| 2019/0096868 A1* | 3/2019 | Tsou .................. H01L 23/3135 |
| 2019/0109098 A1* | 4/2019 | Lin .......................... H01L 24/19 |
| 2019/0198474 A1* | 6/2019 | Abraham ................ H01L 24/14 |
| 2020/0091099 A1* | 3/2020 | Choi ........................ H01L 23/13 |
| 2020/0105544 A1* | 4/2020 | Tsai ....................... H01L 21/4853 |
| 2020/0144224 A1* | 5/2020 | Lin ........................ H01L 23/481 |

FOREIGN PATENT DOCUMENTS

| | | | |
|---|---|---|---|
| DE | 102019129870 A1 * | 4/2021 | ........... H01L 21/565 |
| JP | 2005136152 | 5/2005 | |
| TW | 201822333 | 6/2018 | |
| TW | 201906092 | 2/2019 | |
| TW | 201927086 | 7/2019 | |
| WO | 2016073049 | 5/2016 | |

OTHER PUBLICATIONS

"Office Action of China Counterpart Application", issued on Feb. 6, 2024, p. 1-p. 9.

* cited by examiner

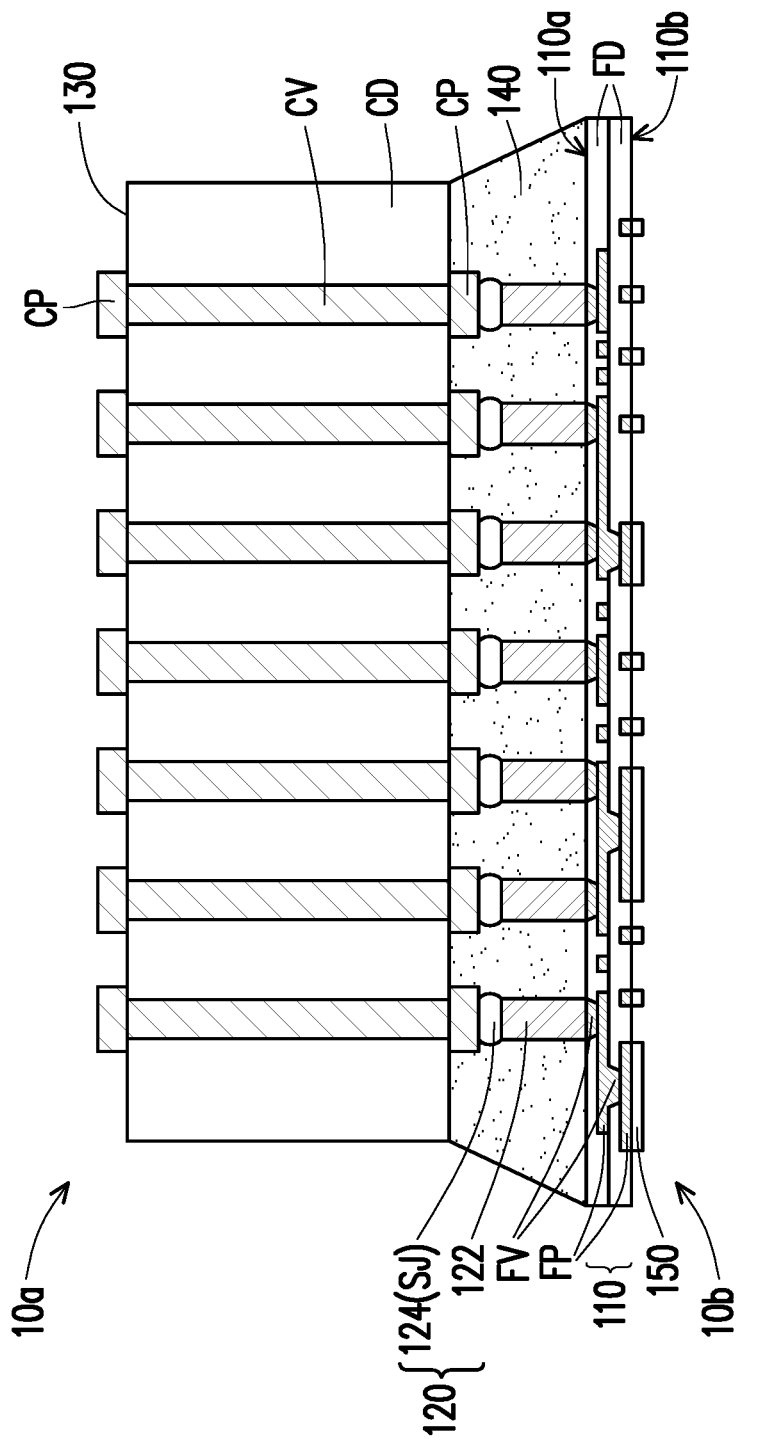

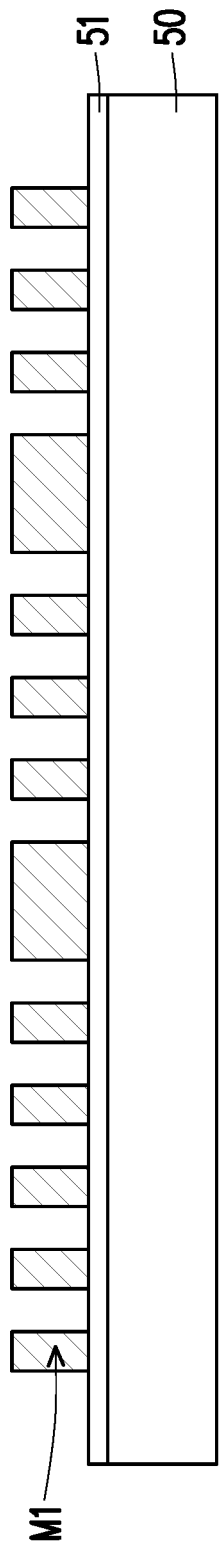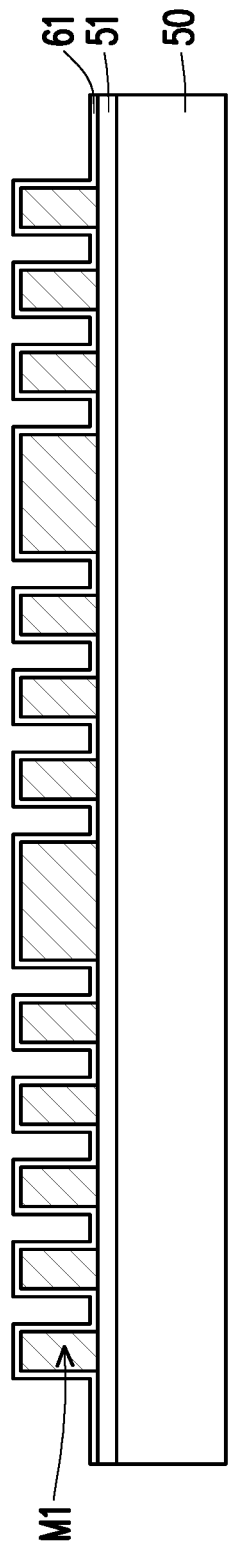
FIG. 6A
FIG. 6B

INTEGRATED SUBSTRATE STRUCTURE, REDISTRIBUTION STRUCTURE, AND MANUFACTURING METHOD THEREOF

CROSS REFERENCE TO RELATED APPLICATION

This application claims the priority benefit of U.S. provisional application Ser. No. 62/935,641, filed on Nov. 15, 2019. The entirety of the above-mentioned patent application is hereby incorporated by reference herein and made a part of specification.

BACKGROUND OF THE INVENTION

1. Field of the Invention

The present invention relates to an integrated substrate structure, a redistribution structure, and manufacturing methods thereof, and more specifically relates to an integrated substrate structure for coupling/testing semiconductor devices, a redistribution structure having fine circuitry and methods for forming the same.

2. Description of Related Art

As the electronic industry has rapidly developed, the trend in semiconductor dies has been to gradually move toward miniaturization and integration. The terminal count on the highly integrated device increases as integration become higher, and it is difficult for a circuit substrate to meet the pitch of terminals on such device/wafer. In this respect, an integrated substrate structure having a fine-pitched interconnection for coupling/testing a fine-pitched device/wafer is desired in the field.

SUMMARY OF THE INVENTION

The invention provides an integrated substrate structure and manufacturing methods thereof. The integrated substrate structure including a thin-film redistribution layer coupled to a circuit substrate can meet the requirements such as reliability, good electrical performance, thinness, stiffness, planarity, competitive unit price, etc. for connecting/testing a semiconductor wafer having fine-pitched terminals.

The invention provides an integrated substrate structure including a redistribution film, a circuit substrate, and a plurality of conductive features. The redistribution film includes a fine redistribution circuitry, a circuit substrate is disposed over the redistribution film and includes a core layer and a coarse redistribution circuitry disposed in and on the core layer. The circuit substrate is thicker and more rigid than the redistribution film, and a layout density of the fine redistribution circuitry is denser than that of the coarse redistribution circuitry. The conductive features are interposed between the circuit substrate and the redistribution film to be connected to the fine redistribution circuitry and the coarse redistribution circuitry.

In some embodiments, each of the conductive features includes a conductive pillar landing on the fine redistribution circuitry and electrically coupled to the coarse redistribution circuitry through a solder joint. In some embodiments, each of the conductive features is a conductive pad disposed on the fine redistribution circuitry and electrically coupled to a conductive pillar landing on the coarse redistribution circuitry through a solder joint. In some embodiments, each of the conductive features includes a conductive pad and a conductive bump, the conductive pad is disposed on the fine redistribution circuitry, and the conductive bump is disposed on the conductive pad and electrically coupled to the coarse redistribution circuitry through a solder joint. In some embodiments, the conductive pad is a copper-containing pad and the conductive bump is a gold-containing bump. In some embodiments, the conductive features disposed on the fine redistribution circuitry are directly bonded to the coarse redistribution circuitry, and a contact area of the respective conductive feature and the coarse redistribution circuitry is equal to a bonding surface area of the respective conductive feature. In some embodiments, the integrated substrate structure further includes an underfill layer interposed between the circuit substrate and the redistribution film to cover the plurality of conductive features, where a boundary of the underfill layer on the redistribution film is substantially leveled with an outer sidewall of the redistribution film. In some embodiments, the integrated substrate structure further includes a surface finishing layer disposed on the fine redistribution circuitry of the redistribution film opposite to the plurality of conductive features.

The invention further provides a method that includes at least the following steps. A plurality of conductive features is formed on a fine redistribution circuitry of a redistribution film. A coarse redistribution circuitry of a circuit substrate is bonded to the plurality of conductive features to electrically connect the coarse redistribution circuitry to the fine redistribution circuitry. A redundant portion of the redistribution film that is unmasked by the circuit substrate is trimmed to form an integrated substrate structure.

In some embodiments, forming the conductive features includes forming a plurality of pillar portions on the fine redistribution circuitry of the redistribution film, and forming a solder material on each of the plurality of pillar portions to form a cap portion thereon. In some embodiments, bonding the circuit substrate to the conductive features includes placing the circuit substrate on the conductive features, and reflowing the cap portions of the conductive features to bond the coarse redistribution circuitry of the circuit substrate to the pillar portions of the conductive features. In some embodiments, the method further includes before trimming the redistribution film, forming an underfill layer on the redistribution film to fill a gap between the redistribution film and the circuit substrate and cover the conductive features, where when trimming the redistribution film, the redundant portion of the redistribution film is defined by a boundary of the underfill layer on the redistribution film. In some embodiments, the method further includes after trimming the redistribution film, forming a surface finishing layer on the fine redistribution circuitry of the redistribution film that is opposite to the plurality of conductive features. In some embodiments, forming the conductive features on the redistribution film includes forming conductive pads on the fine redistribution circuitry of the redistribution film, and bonding the circuit substrate to the conductive features includes placing solder caps of conductive connectors on the coarse redistribution circuitry of the circuit substrate on the conductive pads, and reflowing the solder caps to form solder joints connecting the conductive connectors of the circuit substrate to the conductive pads. In some embodiments, forming the conductive features on the redistribution film includes forming conductive pads on the fine redistribution circuitry of the redistribution film, and bonding conductive bumps to the conductive pads with a one-to-one correspondence, and bonding the circuit substrate to the conductive features includes placing solder caps that are formed on the coarse redistribution circuitry of the circuit substrate on the conductive bumps, and reflowing the solder caps to form solder joints connecting the coarse redistribution circuitry of the circuit substrate to the conductive bumps. In some embodiments, bonding the circuit substrate to the conductive features includes placing conductive pads of the coarse redistribution circuitry of the circuit substrate directly on the conductive features, and applying an energy to an interface of the conductive pads of the coarse redistribution circuitry and the conductive features to bond the conductive pads of the coarse redistribution circuitry to the conductive features. In some embodiments, the method further includes performing electrical testing on a semiconductor wafer using the integrated substrate structure, where testing tips for contacting the semiconductor wafer are formed on the fine redistribution circuitry of the redistribution film, and the circuit substrate is coupled to a signal source carrier through conductive terminals formed on the coarse redistribution circuitry.

The invention further provides a redistribution structure including a first conductive pattern, a first patterned dielectric layer, a first dielectric liner, a second conductive pattern, a second patterned dielectric layer, and a second dielectric liner. The first patterned dielectric layer covers the first conductive pattern, the first dielectric liner is interposed between the first conductive pattern and the first patterned dielectric layer and conformally coves the first conductive pattern, the second conductive pattern is disposed on the first patterned dielectric layer and penetrates through the first patterned dielectric layer and the first dielectric liner to land on the first conductive pattern, the second patterned dielectric layer is disposed over the first patterned dielectric layer, and the second dielectric liner is interposed between the second conductive pattern and the second patterned dielectric layer to physically separate the second conductive pattern from the second patterned dielectric layer.

In some embodiments, the second dielectric liner conformally covers the second conductive pattern and is interposed between the first patterned dielectric layer and the second patterned dielectric layer, and materials of the first dielectric liner and the second dielectric liner are different from materials of the first patterned dielectric layer and the second patterned dielectric layer. In some embodiments, the redistribution structure further includes a conductive terminal including a bump portion and a cap portion disposed on the bump portion, and the bump portion is disposed on the second patterned dielectric layer and penetrates through the second patterned dielectric layer and the second dielectric liner to land on the second conductive pattern.

Based on the above, the integrated substrate structure including a circuit substrate and a thin-film redistribution structure coupled to the circuit substrate may serve as a space transformer for electrical testing a semiconductor wafer since the integrated substrate structure can meet various pitch requirements of different types of semiconductor wafer. The thin-film redistribution structure may be used to connect fine-pitched testing pads on the semiconductor wafer and the circuit substrate may be used to connect the testing PCB of the signal source carrier. By such configuration, the integrated substrate structure may meet the requirements including reliability, good electrical performance, thinness, stiffness, planarity, competitive unit price for connecting/testing a semiconductor wafer.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1J are schematic cross-sectional views illustrating a manufacturing method of an integrated substrate structure according to some embodiments.

FIG. 6A to FIG. 6I are schematic cross-sectional views illustrating a manufacturing method of a redistribution structure having fine circuitry according to some embodiments.

DESCRIPTION OF THE EMBODIMENTS

Figure 1A:
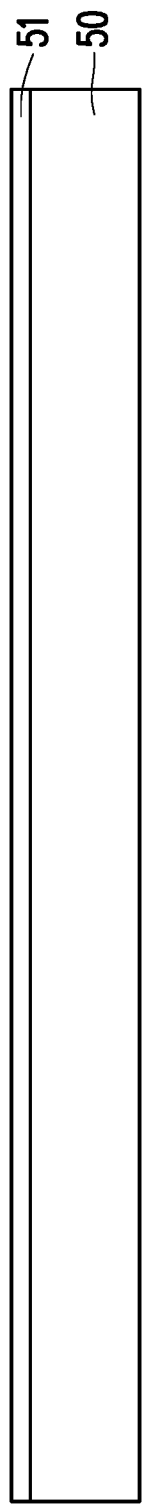

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1J are schematic cross-sectional views illustrating a manufacturing method of an integrated substrate structure according to some embodiments. Referring to FIG. 1A, a temporary carrier 50 is provided with a release layer 51. The temporary carrier 50 may be made of glass, plastic, silicon, metal, or other suitable materials as long as the material is able to withstand the subsequent processes while carrying a structure formed thereon. In some embodiments, the release layer 51 (e.g., a light to heat conversion film, or other suitable de-bonding layer) is applied on the temporary carrier 50 to enhance the releasability of the subsequently formed structure from the temporary carrier 50 in a subsequent de-bonding process. Alternatively, the release layer 51 is omitted.

Figure 1B:
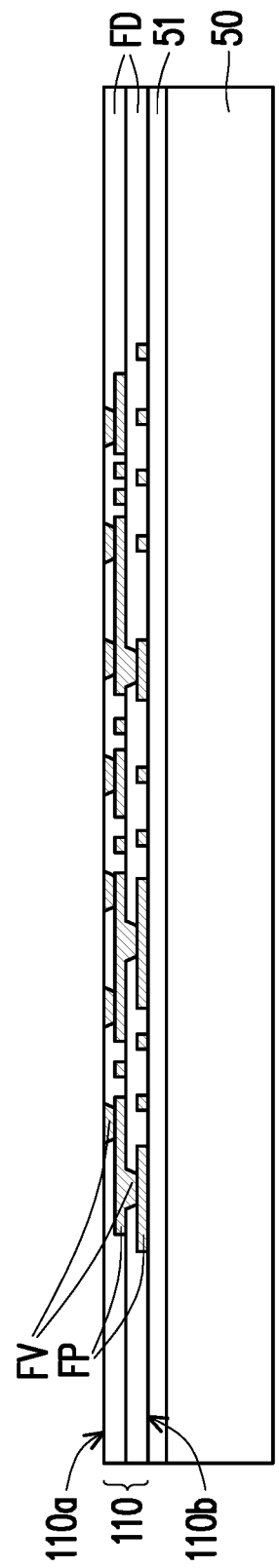

Referring to FIG. 1B, a thin-film redistribution structure 110 may be formed over the temporary carrier 50. For example, the thin-film redistribution structure 110 including fine conductive patterns FP, fine dielectric layers FD, and fine conductive vias FV is formed over the temporary carrier 50. The release layer 51 may be interposed between the thin-film redistribution structure 110 and the temporary carrier 50. The fine conductive patterns FP and the fine conductive vias FV that are embedded in the fine dielectric layers FD may be collectively viewed as a fine redistribution circuitry of thin-film redistribution structure 110. In some embodiments, the fine dielectric layers FD are stacked upon one another. The material(s) of the fine dielectric layers FD may be or may include polyimide (PI), benzocyclobutene (BCB), polybenzoxazole (PBO), inorganic dielectric material (e.g., silicon oxide, silicon nitride, or the like), or other suitable electrically insulating materials. The material(s) of the fine conductive pattern FP and the fine conductive via FV may be or may include copper, gold, nickel, aluminium, platinum, tin, metal alloy, combinations thereof, or other suitable conductive material(s).

In some embodiments, the fine conductive patterns FP may be formed and patterned over the temporary carrier 50 using a metallic deposition process, lithography and etching process, or other suitable techniques. In some embodiments, the fine conductive pattern FP at the bottom level close to the temporary carrier 50 includes a plurality of conductive pads for subsequently element-mounting process (not shown). Next, the fine dielectric layer FD with openings may be formed over the temporary carrier 50 to cover the fine conductive pattern FP using, e.g., a coating process, lithography and etching processes, or other suitable techniques. The openings of the fine dielectric layer FD may expose at least a portion of the fine conductive pattern FP for further electrical connection. Alternatively, the fine dielectric layer FD is formed before the formation of the fine conductive pattern FP. Subsequently, a conductive material may be formed in the openings of the fine dielectric layer FD to form the fine conductive vias FV using plating, deposition, or other suitable process. The term "conductive vias" may be the elements that provide vertical electrical connection between layers and go through the plane of one or more adjacent layers. The conductive material may also be formed on the top surface of fine dielectric layer FD when forming the conductive material in the openings, and then the conductive material on the top surface of fine dielectric layer FD patterned to form another level of the fine conductive pattern FP. The fine conductive pattern FP on the top surface of fine dielectric layer FD may include conductive lines and pads. The fine conductive pattern FP may be referred to as a patterned conductive layer with fine line/space wirings.

The abovementioned steps may be performed multiple times, such that the fine conductive patterns FP and the fine dielectric layers FD are alternately stacked and the fine conductive vias FV are embedded in the fine dielectric layers FD. The fine conductive vias FV may be formed to be electrically and physically connected between the fine conductive patterns FP in different layers. In some embodiments, the thin-film redistribution structure 110 is a stack of layers having fine line/space routing. It should be noted that the thin-film redistribution structure 110 shown in FIG. 1B is merely exemplary, more levels or less levels of the redistribution structure may be formed as required by the circuit design.

Continue to FIG. 1B, the thin-film redistribution structure 110 includes a first surface 110a and a second surface 110b opposite to each other, where the second surface 110b faces the temporary carrier 50. The fine conductive pattern FP and the fine dielectric layer FD at the second surface 110b of the thin-film redistribution structure 110 may be substantially leveled. In some embodiments, the fine conductive vias FV and the fine dielectric layer FD at the first surface 110a of the thin-film redistribution structure 110 may be substantially leveled. The fine conductive pattern FP may be formed at the top surface of the uppermost one of the fine dielectric layers FD. Under this scenario, the first surface 110a includes the fine conductive pattern FP and the uppermost one of the fine dielectric layers FD. In some embodiments, the fine conductive vias FV are tapered towards the temporary carrier 50. Alternatively, the fine conductive vias FV include vertical sidewalls with respective to the second surface 110b. The thin-film redistribution structure 110 may have a thickness ranging from about 2 μm to about 10 μm. Although other values may be possible depending on product requirements/process recipes.

Figure 1C:
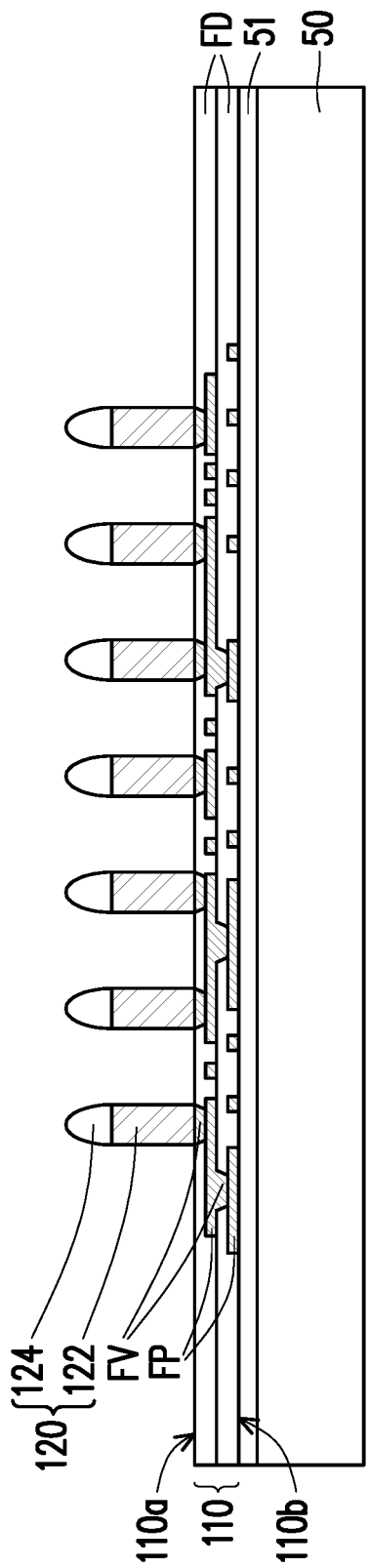

Referring to FIG. 1C, a plurality of conductive features 120 are formed on the first surface 110a of the thin-film redistribution structure 110. For example, the respective conductive feature 120 includes a pillar portion 122 formed on the first surface 110a of the thin-film redistribution structure 110 and a cap portion 124 formed on the pillar portion 122. In some embodiments, the pillar portions 122 and the fine conductive vias FV are plated during the same step. Alternatively, after forming the thin-film redistribution structure 110, the pillar portions 122 are separately formed (or placed on the thin-film redistribution structure 110). In some embodiments, the pillar portion 122 and the overlying cap portion 124 are made of different materials. For example, the pillar portion 122 includes copper, gold, nickel, aluminium, platinum, tin, combinations thereof, an alloy thereof, or another suitable conductive material. The cap portion 124 may include solder material or the like. In some embodiments, the cap portions 124 are omitted. It is noted that the number of the conductive features 120 shown herein is only for illustrative purpose and construes no limitation in the disclosure.

Figure 1D:
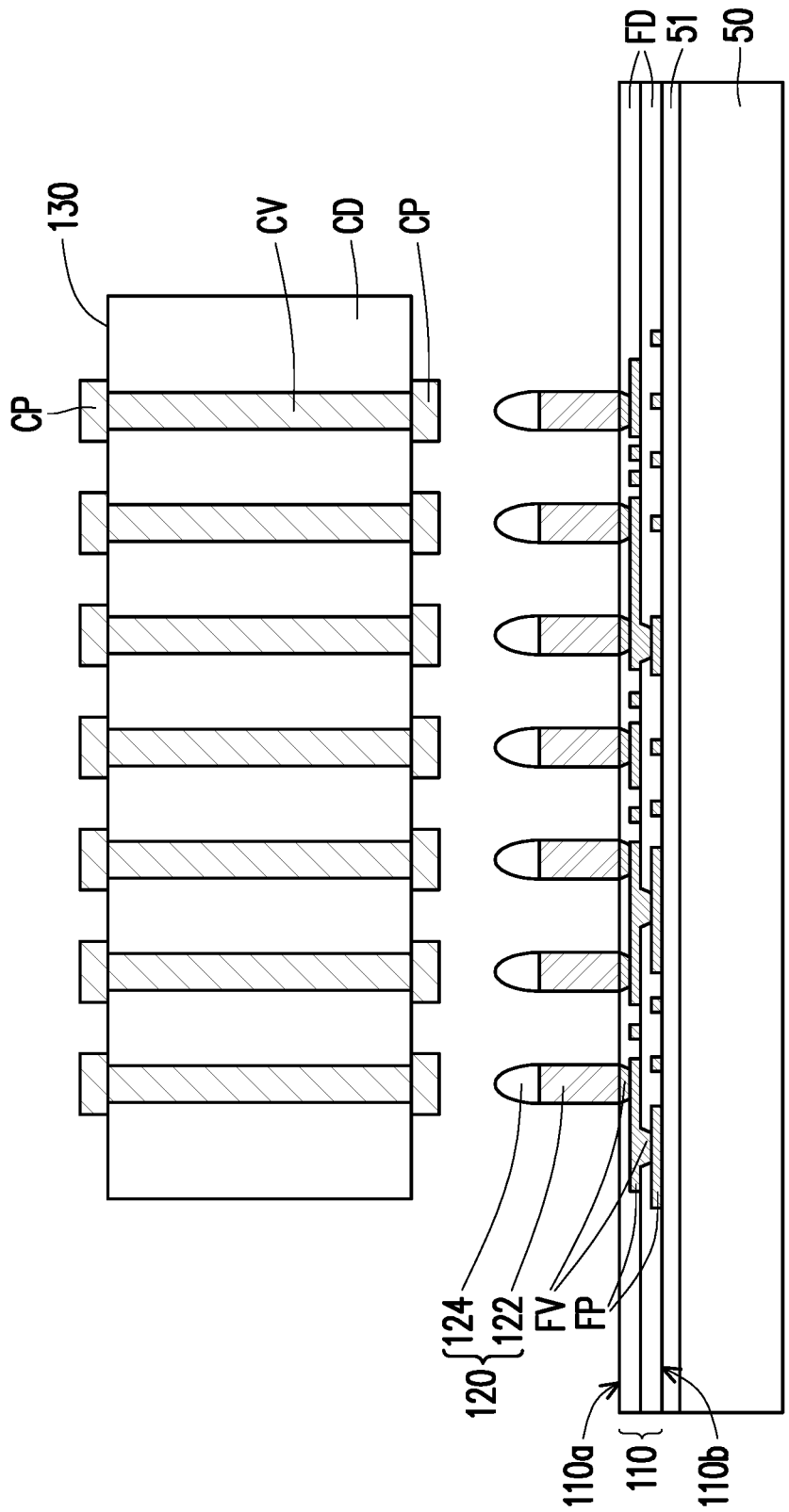

Referring to FIG. 1D, a circuit substrate 130 is provided. For example, the circuit substrate 130 and the thin-film redistribution structure 110 are separately fabricated. In some embodiments, the thickness of the circuit substrate 130 is greater than that of the thin-film redistribution structure 110. The circuit substrate 130 may be more rigid than the thin-film redistribution structure 110. In some embodiments, the circuit substrate 130 includes a core layer CD, circuit patterns CP disposed on two opposing sides of the core layer CD, and through vias CV penetrating through the core layer CD to be connected to the circuit patterns CP.

In some embodiments, the core layer CD includes a ceramic substrate. Although a single core layer CD is illustrated, the core layer may include a plurality of dielectric sublayers stacked upon one another to form a rigid core. In some embodiments, the core layer CD includes insulating materials (e.g., polyimide, epoxy resin, FR-4, glass fiber, BT, combination of these, and/or the like) or other suitable organic/inorganic dielectric material(s). The respective circuit pattern CP may be or may include conductive pads, conductive lines, conductive vias, etc., and may be made of conductive material such as copper, gold, nickel, aluminium, platinum, tin, combinations thereof, an alloy thereof, etc. The through vias CV may include any suitable conductive material which is the same or similar to the circuit patterns CP, and may provide vertical connections between the circuit patterns CP disposed on two opposing sides of the core layer CD. In some embodiments, the circuit substrate 130 is formed by a build-up process that stacks the core layer(s) CD and the circuit patterns CP and forms the through vias CV in the core layer CD to be electrically connected to the circuit patterns CP. In some embodiments, the circuit substrate 130 is formed as a symmetrical built-up structure. Other suitable process/technique may be employed to form the circuit substrate 130.

In some embodiments, the circuit patterns CP and the through vias CV are coarser and thicker than the fine conductive patterns FP and the fine conductive vias FV of the thin-film redistribution structure 110. That is, the pitch of the fine conductive patterns FP is finer than that of the respective circuit pattern CP. For example, the fine conductive pattern FP of the thin-film redistribution structure 110 has a line-spacing finer than the line-spacing of the respective circuit pattern CP. In some embodiments, a dimension (e.g., height, depth, width, outer diameter, etc.) of the respective through via CV is greater than that of the fine conductive via FV of the thin-film redistribution structure 110. The core layer CD may also be thicker and more rigid than the fine dielectric layer(s) FD. For example, the thickness of the core layer CD ranges from about 0.1 mm to about 5 mm. It is noted that the configuration of the circuit substrate 130 is only for illustrative purpose, and additional elements/circuitries may be formed in/on the core layer depending on circuit design.

Figure 1E:
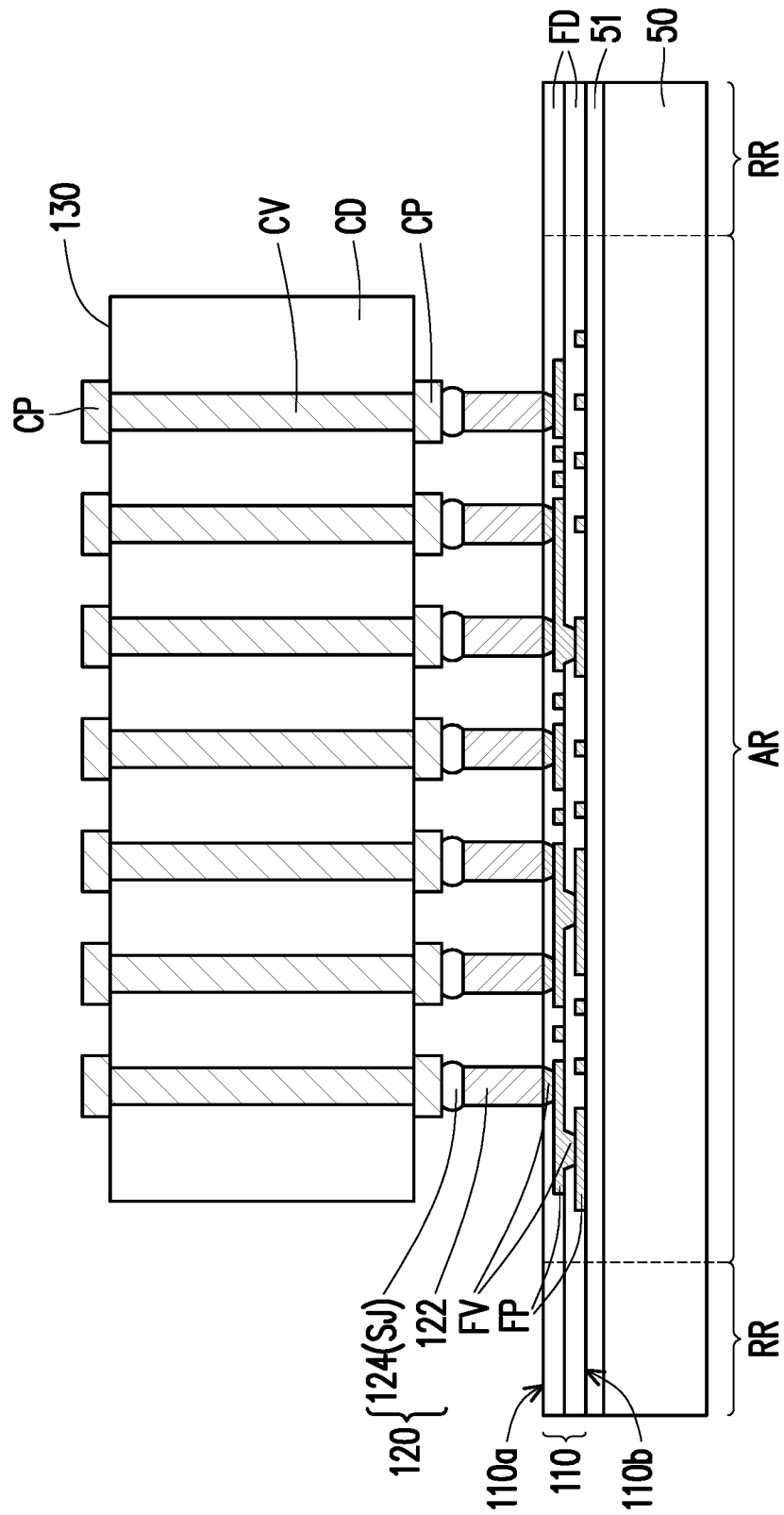

Referring to FIG. 1E and also with reference to FIG. 1D, the circuit substrate 130 may be disposed over the thin-film redistribution structure 110 and may be electrically coupled to the thin-film redistribution structure 110 through the conductive features 120. For example, the circuit substrate 130 is picked and placed on the conductive features 120. A reflow process may be performed on the cap portions 124 to bond the circuit pattern CP of the circuit substrate 130 to the pillar portions 122 of the conductive features 120. After the reflow and a curing process, the cap portions 124 may be turned to solder joints SJ that are coupled to the pillar portions 122 and the circuit pattern CP. For example, a copper-solder-copper connection is formed between the thin-film redistribution structure 110 and the circuit substrate 130. The solder material (e.g., the cap portions) may be formed on the pillar portions 122 of the conductive features 120 and/or may be applied to the circuit pattern CP of the circuit substrate 130.

In some embodiments, after disposing the circuit substrate 130 over the thin-film redistribution structure 110, the orthographic projection area of the circuit substrate 130 on the first surface 110a of the thin-film redistribution structure 110 may be less than the surface area of the first surface 110a of the thin-film redistribution structure 110. Although only one circuit substrate is shown, a plurality of the circuit substrates may be mounted on the thin-film redistribution structure 110 depending on product requirements. For example, the thin-film redistribution structure 110 includes an active region AR and a redundant region RR surrounding the active region AR, where the circuit substrate 130 may be mounted within the active region AR of the thin-film redistribution structure 110, and the portion within the redundant region RR may be viewed as a sacrificial portion of the thin-film redistribution structure 110.

Figure 1F:
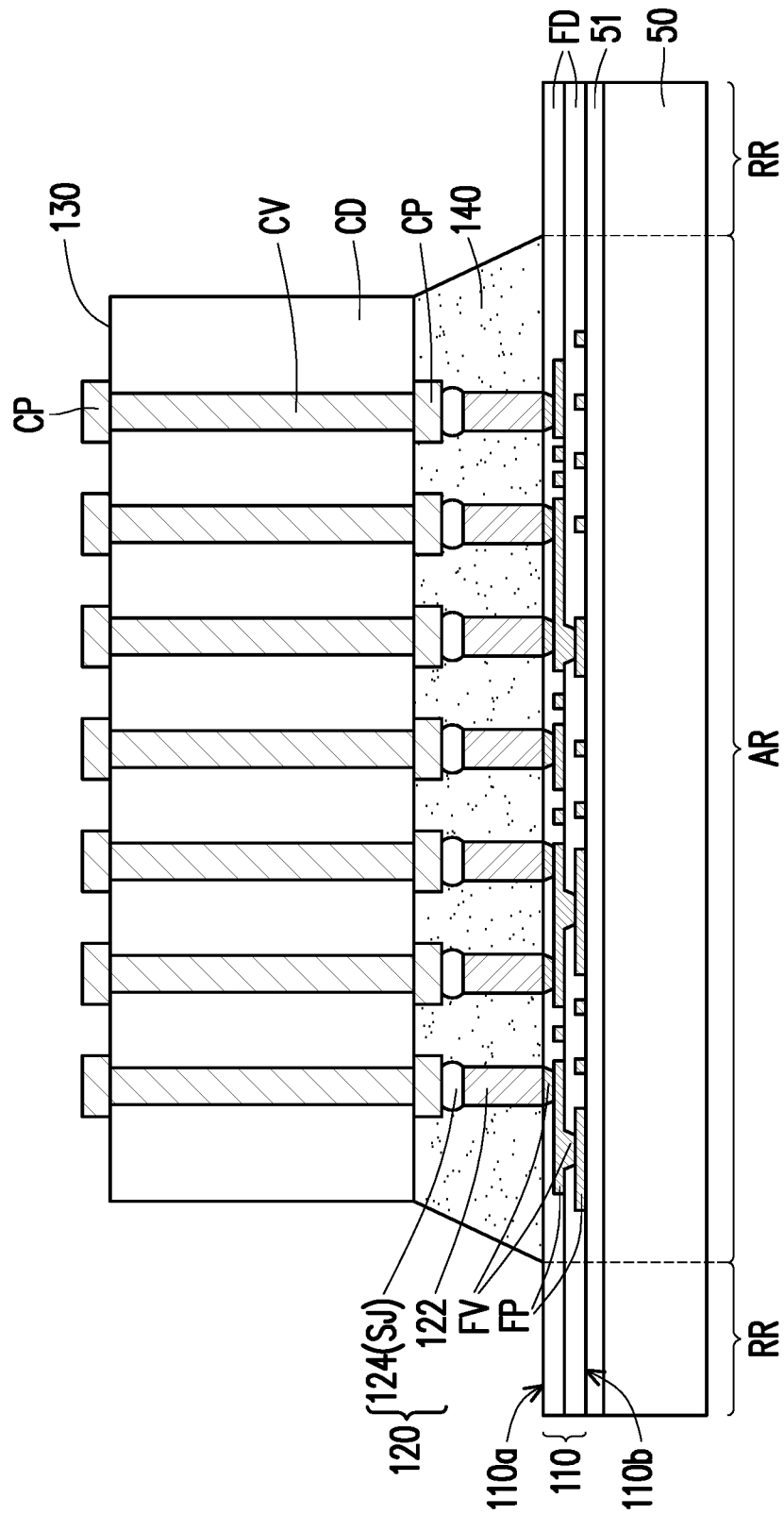

Referring to FIG. 1F, an underfill layer 140 may be formed between the thin-film redistribution structure 110 and the circuit substrate 130 to cover the conductive features 120 and/or the circuit pattern CP bonded to the conductive features 120 for protection. For example, a dispensing process of underfill material followed by a curing process may be performed to form the underfill layer 140. For example, the underfill layer 140 fills the gap between the first surface 110a of the thin-film redistribution structure 110 and the bottom surface of the circuit substrate 130 to surround the conductive features 120 and/or the circuit pattern CP bonded to the conductive features 120. Alternatively, the underfill layer 140 is omitted.

Figure 1G:
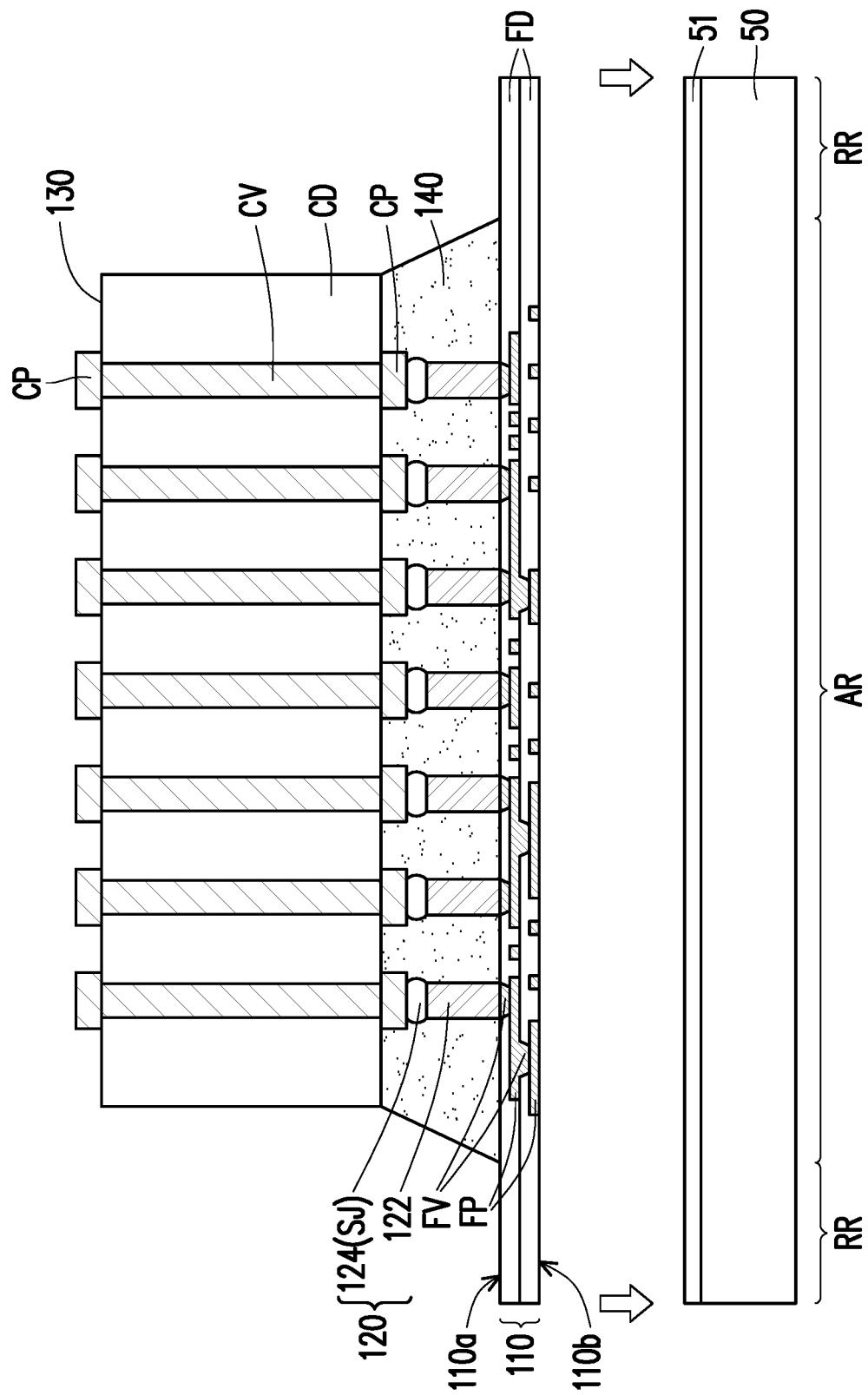

Referring to FIG. 1G, the temporary carrier 50 and the release layer 51 may be removed from the thin-film redistribution structure 110. For example, the temporary carrier 50 is removed from the second surface 110b of the thin-film redistribution structure 110 by applying external energy (e.g., heat and/or pressure, etc.) to the release layer 51 located between the thin-film redistribution structure 110 and the temporary carrier 50, thereby delaminating the release layer 51 from the thin-film redistribution structure 110. Other suitable processes (e.g., mechanical removing, etching, grinding, etc.) may be used to remove the temporary carrier 50 and the release layer 51. A cleaning process is optionally performed on the second surface 110b of the thin-film redistribution structure 110 to remove the residues of the release layer 51. The bottommost level of the fine conductive patterns FP leveled with the bottommost level of the fine dielectric layers FD on the second surface 110b may be revealed for further electrical connection after de-bonding.

Figure 1H:
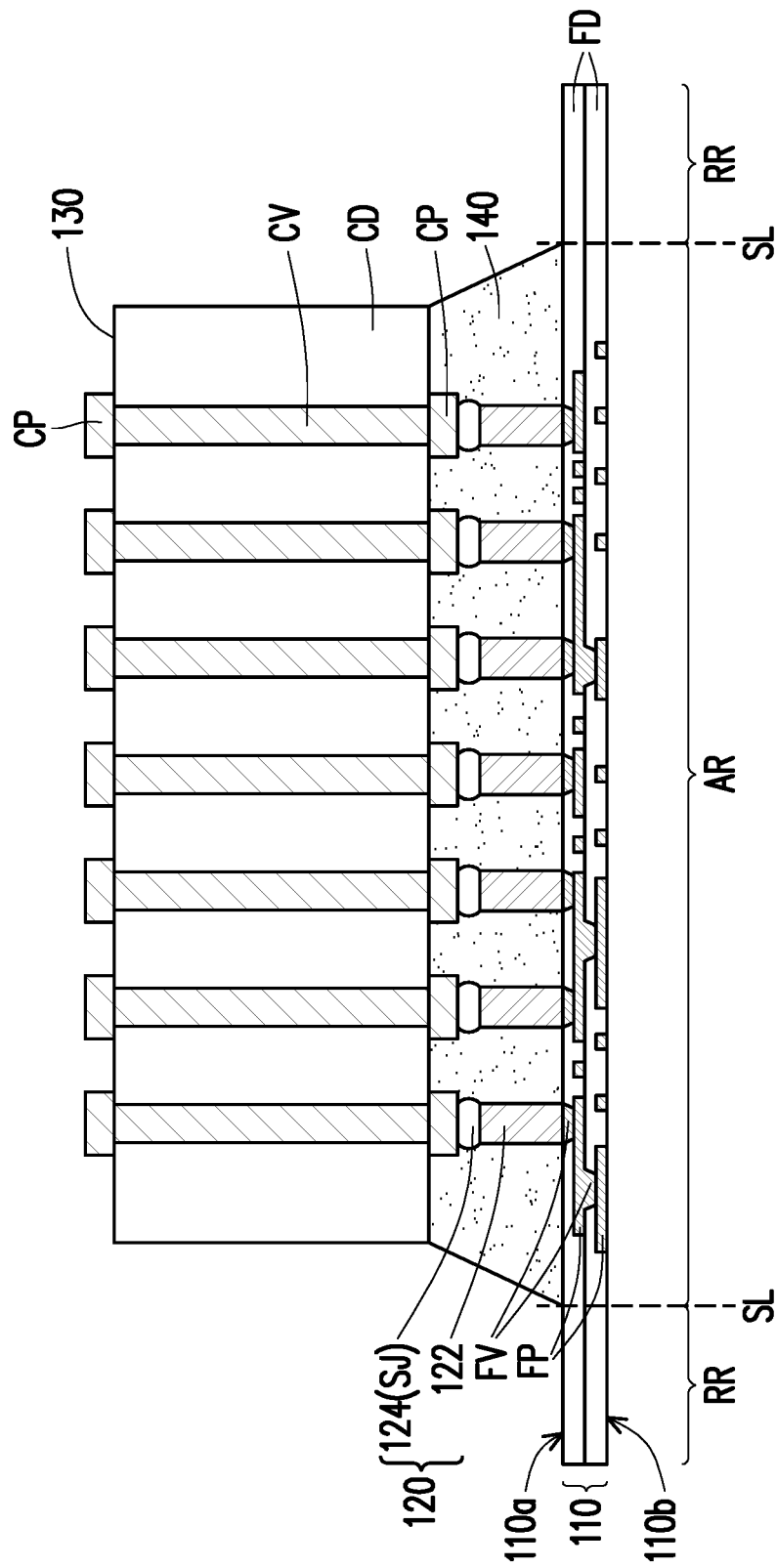
Figure 1I:
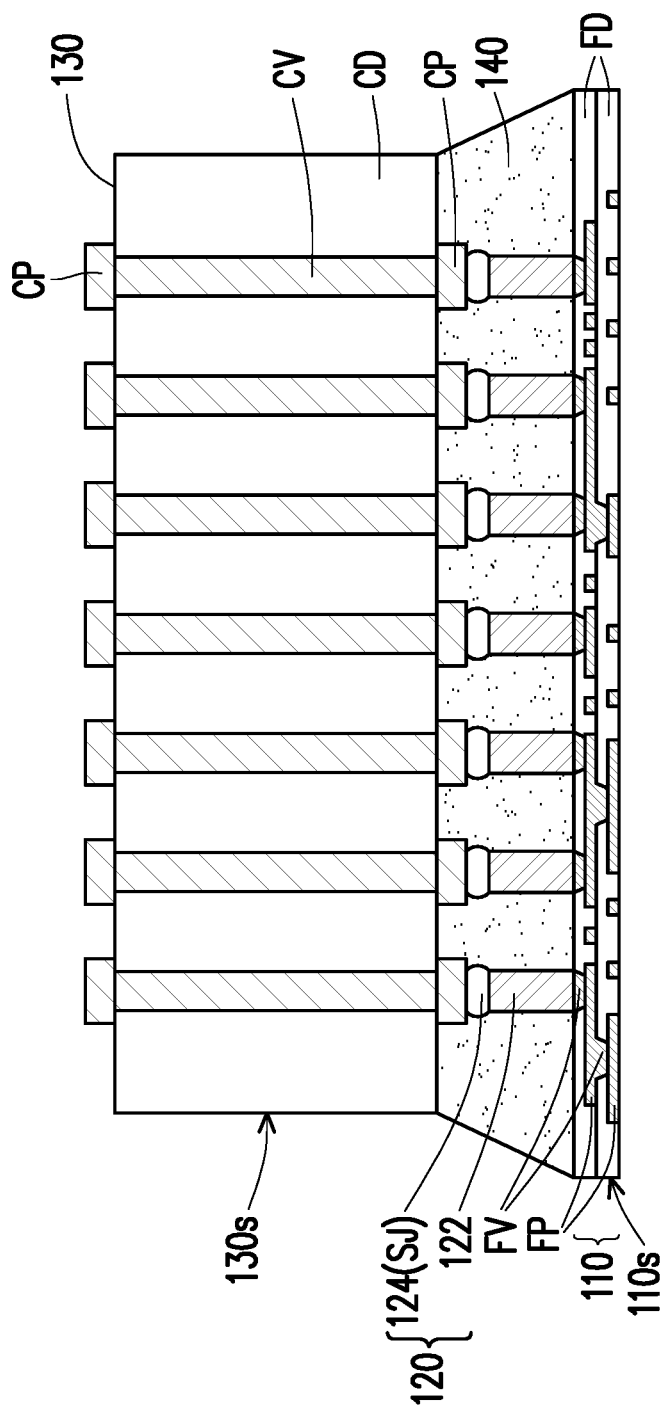

Referring to FIGS. 1H-1I, a portion of the thin-film redistribution structure 110 that is not covered by the circuit substrate 130 and/or the underfill layer 140 may be removed. For example, the portion of the thin-film redistribution structure 110 within the redundant region RR is trimmed using any suitable process such as dicing, laser cutting, etc. In some embodiment, a dicing tool cuts the extra portion of the thin-film redistribution structure 110 along the scribe line SL. For example, a boundary of the underfill layer 140 on the thin-film redistribution structure 110 is substantially leveled with the outer sidewall 110s of the thin-film redistribution structure 110 after trimming. In some embodiments, during the trimming process, a peripheral portion of the underfill layer 140 may also be removed together with the underlying thin-film redistribution structure 110. Under this scenario, the sidewall (or boundary) of the underfill layer 140 may be substantially leveled with the outer sidewall 110s of the thin-film redistribution structure 110. In some embodiments, after trimming, the outer sidewall 110s of the thin-film redistribution structure 110 is substantially leveled with the outer sidewall 130s of the circuit substrate 130 (e.g., the sidewall of the core layer CD). The fine conductive vias FV may be tapered along a direction from the circuit substrate 130 to the thin-film redistribution structure 110.

Referring to FIG. 1J, a surface finishing layer 150 is optionally formed on the thin-film redistribution structure 110. In some embodiments, a surface treatment process is performed on the bottommost layer of the fine conductive pattern FP distributed on the second surface 110b of the thin-film redistribution structure 110 to form the surface finishing layer 150 for protection and/or solderability. The surface finishing layer 150 may be a single metallic layer or may be a multi-metallic layer structure to prevent the fine conductive pattern FP (e.g., copper-containing layer) from diffusing and oxidizing. The surface finishing layer 150 may be or may include nickel, palladium and gold, or other suitable conductive layer(s), and may be formed by plating or other suitable deposition process. Alternatively, the surface finishing layer 150 is omitted. In some embodiments, a plurality of external terminals (e.g., conductive tips, conductive balls, etc.; not shown) may be formed on the surface finishing layer 150 for further electrical connection. Up to here, the fabrication of an integrated substrate structure 10 is substantially complete.

Figure 2A:
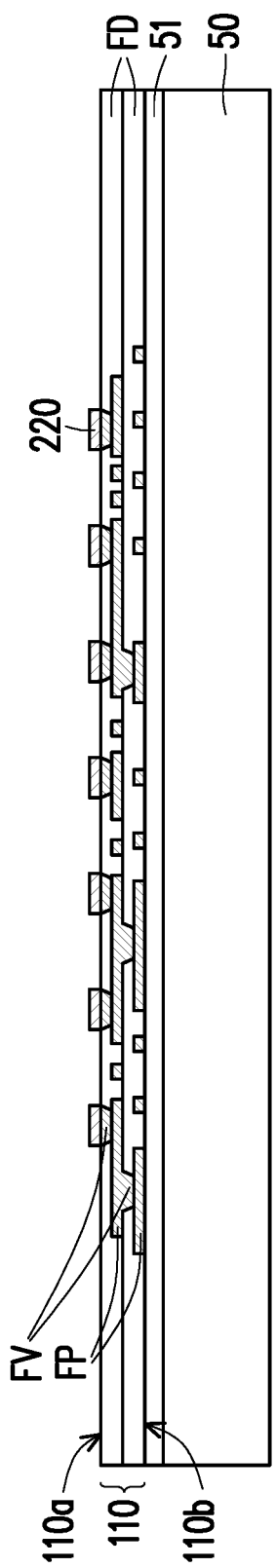
FIG. 2A to FIG. 2G are schematic cross-sectional views illustrating a manufacturing method of an integrated substrate structure according to some embodiments.

FIG. 2A to FIG. 2G are schematic cross-sectional views illustrating a manufacturing method of an integrated substrate structure according to some embodiments. The manufacturing method shown in FIGS. 2A-2G may be similar to the manufacturing method described in FIGS. 1A-1J, the identical or similar numbers refer to the identical or similar elements throughout the drawings, and detail thereof is not repeated. Referring to FIG. 2A, the thin-film redistribution structure 110 including the fine conductive patterns FP and the fine conductive vias FV embedded in the fine dielectric layers FD may be formed over the temporary carrier 50. The release layer 51 may be interposed between the second surface 110b of the thin-film redistribution structure 110 and the temporary carrier 50. The formation of the thin-film redistribution structure 110 may be similar to the step described in FIG. 1A-1B, so the detailed descriptions are not repeated.

After forming the thin-film redistribution structure 110, a plurality of conductive features 220 may be formed on the first surface 110a of the thin-film redistribution structure 110. The conductive features 220 may be or may include conductive pads that are physically connected to the underlying fine conductive vias FV (or the fine conductive patterns FP in some embodiments). The material(s) of the conductive features 220 may be or may include copper, gold, nickel, aluminium, platinum, tin, combinations thereof, an alloy thereof, or another suitable conductive material. The materials of the conductive features 220 may be the same or similar to that of the fine conductive vias FV. In some embodiments, the respective conductive feature 220 formed on the fine conductive via FV at the same plating step. Under this scenario, no significant interface forms between the fine conductive via FV and the overlying conductive pad. Alternatively, the fine conductive vias FV and the overlying conductive features 220 are formed separately at the sequential steps, and an interface therebetween may be observed.

Figure 2B:
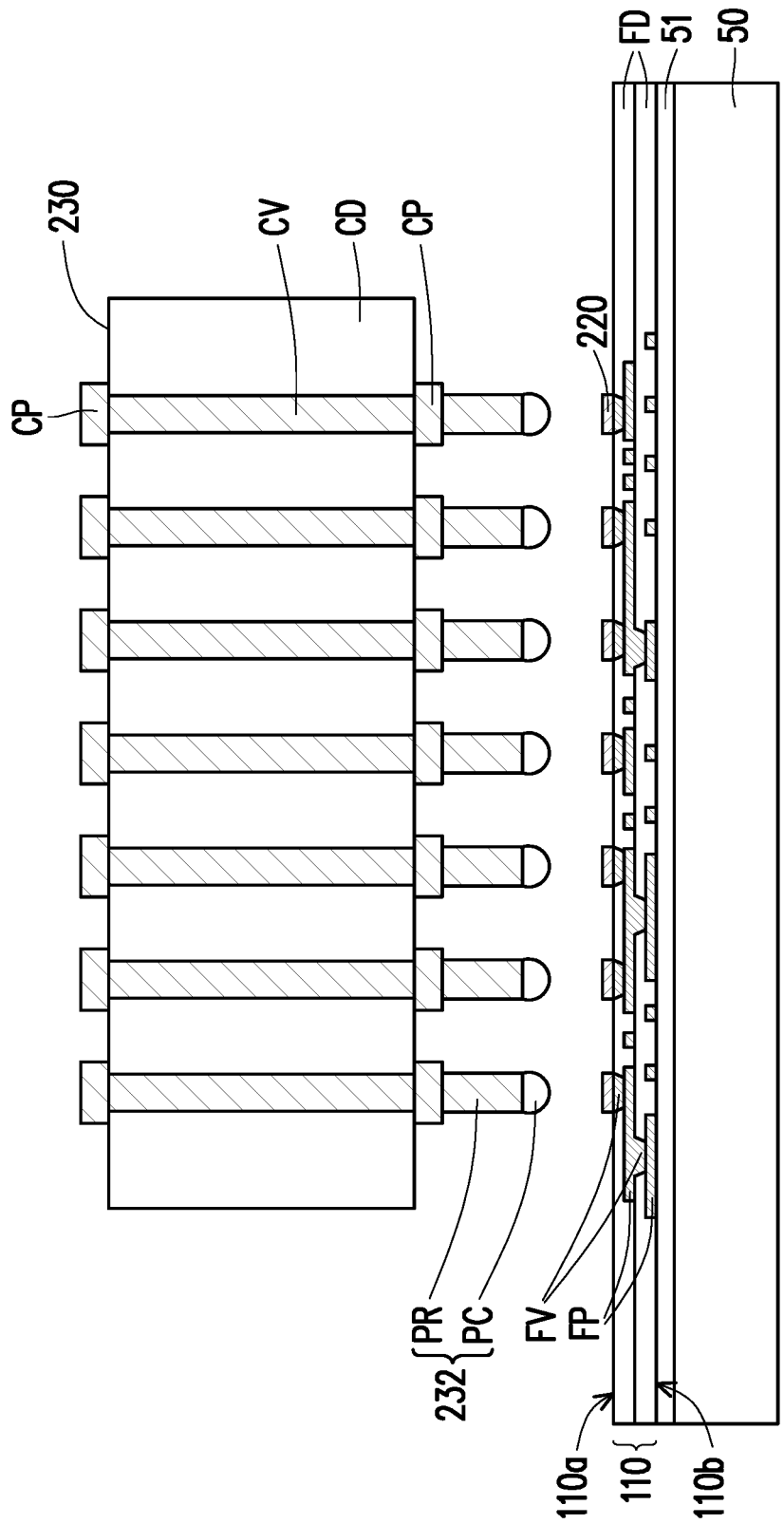

Referring to FIG. 2B, a circuit substrate 230 is provided. For example, the circuit substrate 230 and the thin-film redistribution structure 110 are separately fabricated. In some embodiments, the circuit substrate 230 is thicker and more rigid than the thin-film redistribution structure 110. The circuit substrate 230 may be similar to the circuit substrate 130 described in FIG. 1D, except that the circuit substrate 230 further includes conductive connectors 232 connected to the circuit patterns CP at one side of the core layer CD. The conductive connectors 232 may be electrically coupled to the through vias CV through the circuit patterns CP and may extend along the thickness direction. For example, the respective conductive connector 232 includes a pillar portion PR and a cap portion PC. In some embodiments, the circuit pattern CP bonded to the conductive connectors 232 may include conductive pads for the pillar portions PR landing thereon. The respective pillar portion PR may be thicker than the respective conductive feature 220. The pillar portions PR and the overlying cap portions PC may be made of different conductive materials. For example, the pillar portion PR includes copper, gold, nickel, aluminium, platinum, tin, combinations thereof, an alloy thereof, or another suitable conductive material, and the cap portion PC includes solder material or the like.

Figure 2C:
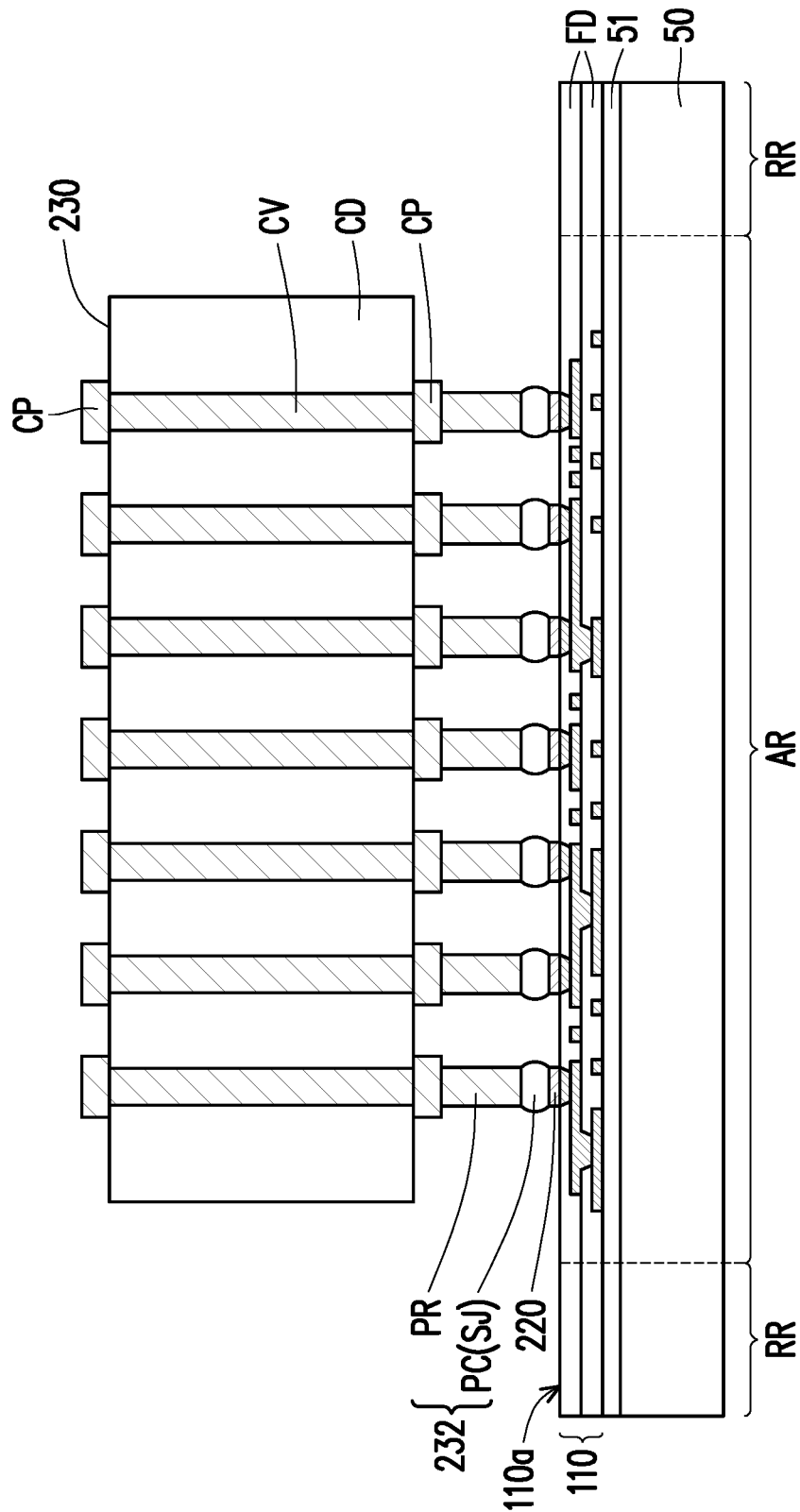

Referring to FIG. 2C and also FIG. 2B, the circuit substrate 230 may be disposed over the thin-film redistribution structure 110 and may be electrically coupled to the thin-film redistribution structure 110 through the conductive features 220 and the conductive connectors 232. For example, each of the conductive connectors 232 of the circuit substrate 230 is substantially aligned with one of the conductive features 220 (e.g., conductive pads), and then the circuit substrate 230 is placed on the conductive features 220 over the thin-film redistribution structure 110. A reflow process may be performed on the cap portions PC of the conductive connectors 232 to bond the pillar portions PR of the circuit substrate 230 to the conductive features 220. After the reflow and a curing process, the cap portions PC may be turned to solder joints SJ that are coupled to the pillar portions PR and the conductive features 220. For example, a copper-solder-copper connection is formed between the thin-film redistribution structure 110 and the circuit substrate 230. In some embodiments, the circuit substrate 230 is mounted within the active region AR of the thin-film redistribution structure 110, and the redundant region RR of the thin-film redistribution structure 110 is viewed as a sacrificial portion.

Figure 2D:
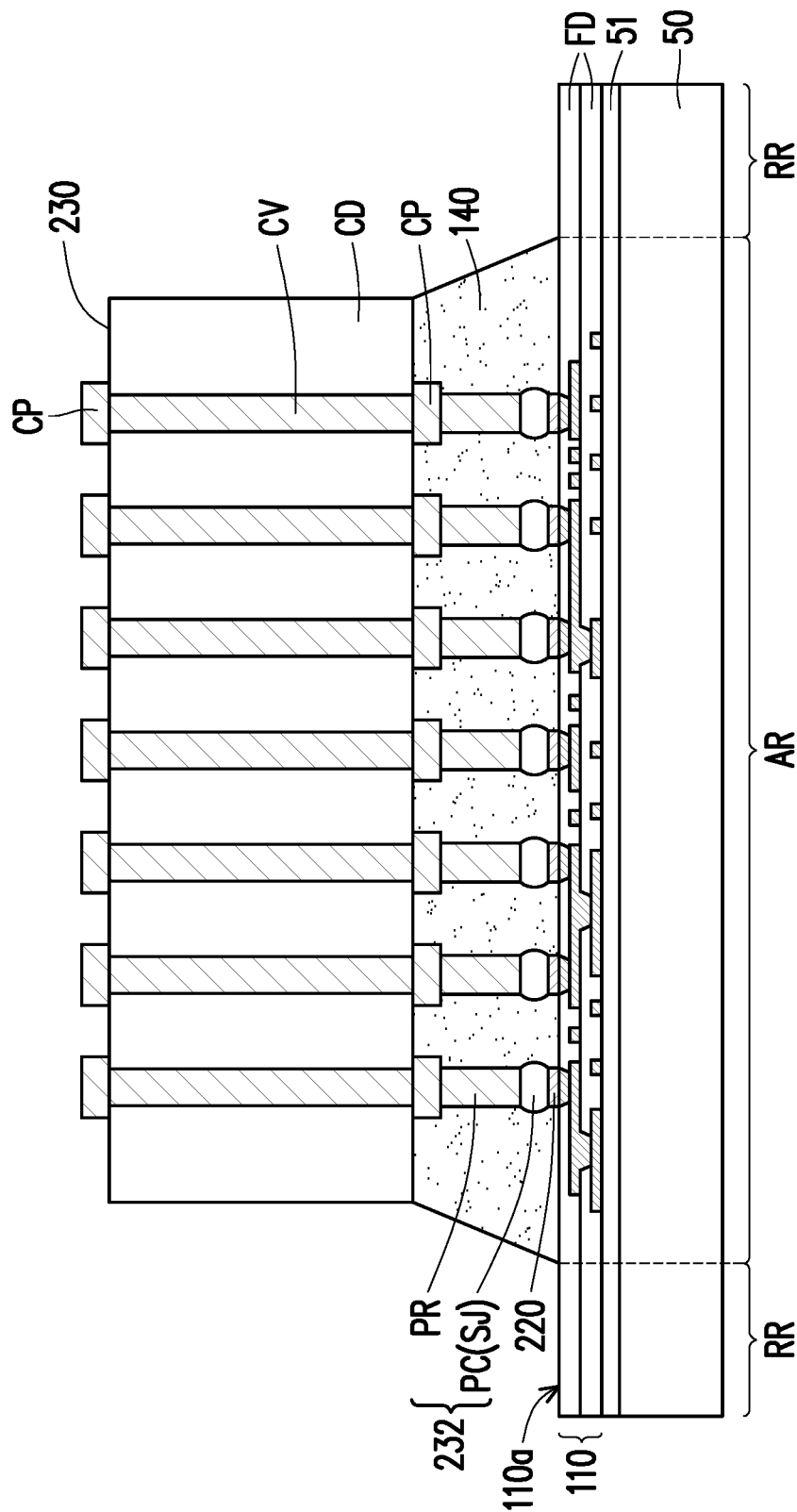

Referring to FIG. 2D, the underfill layer 140 may be formed between the thin-film redistribution structure 110 and the circuit substrate 230 to cover the conductive features 220 and/or the conductive connectors 232 for protection. For example, the underfill layer 140 fills the gap between the first surface 110a of the thin-film redistribution structure 110 and the bottom surface of the core layer CD to surround the conductive features 220 and the conductive connectors 232. The formation of the underfill layer 140 may be similar to the process described in FIG. 1F, so the detailed descriptions are not repeated.

Figure 2E:
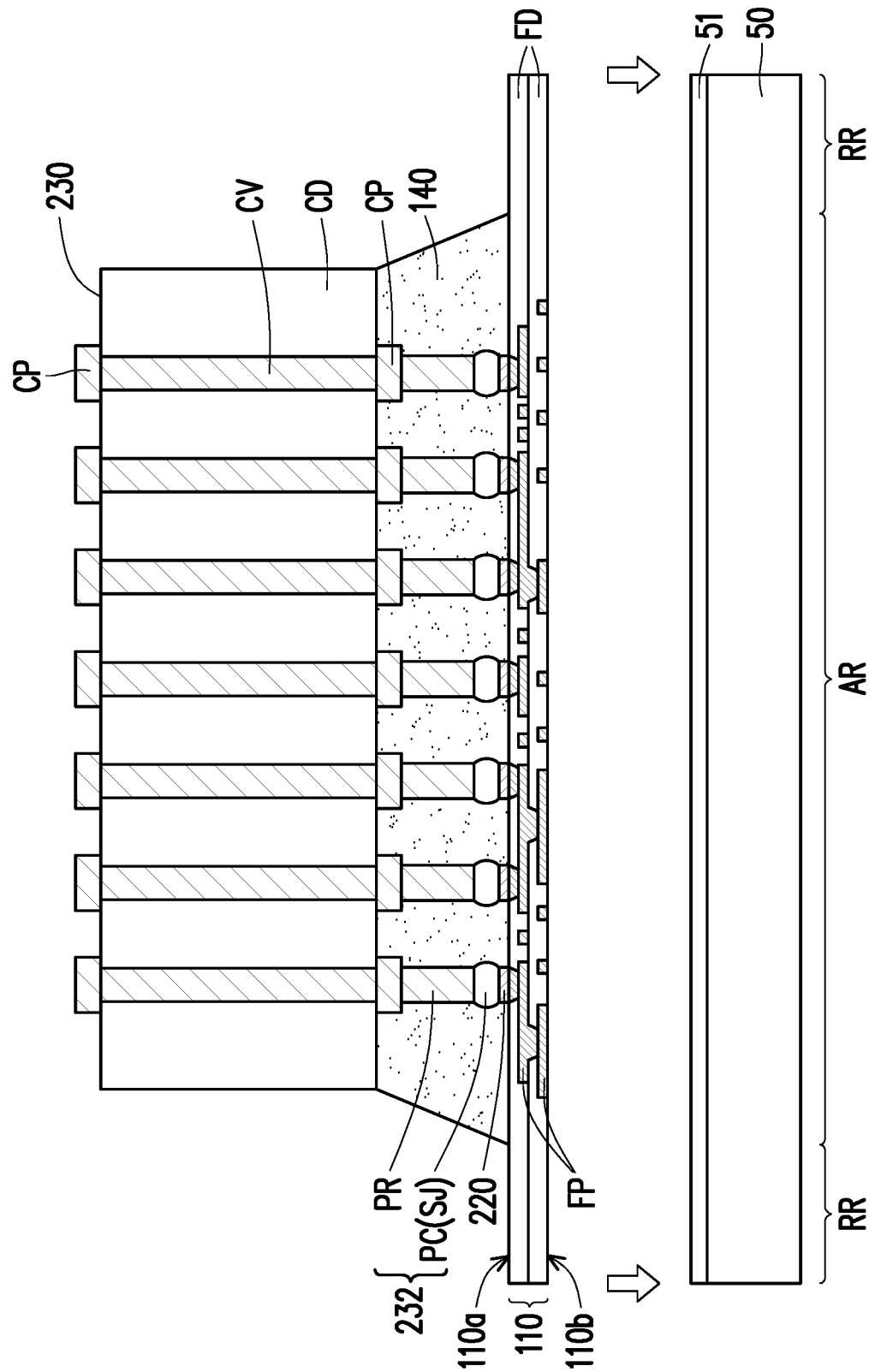

Referring to FIG. 2E, the temporary carrier 50 and the release layer 51 are removed from the thin-film redistribution structure 110 to expose the second surface 110b of the thin-film redistribution structure 110. For example, the bottommost level of the fine conductive patterns FP leveled with the fine dielectric layer FD on the second surface 110b may be revealed for further electrical connection. The debonding process of the temporary carrier 50 may be similar to the process described in FIG. 1G, so the detailed descriptions are not repeated.

Figure 2F:
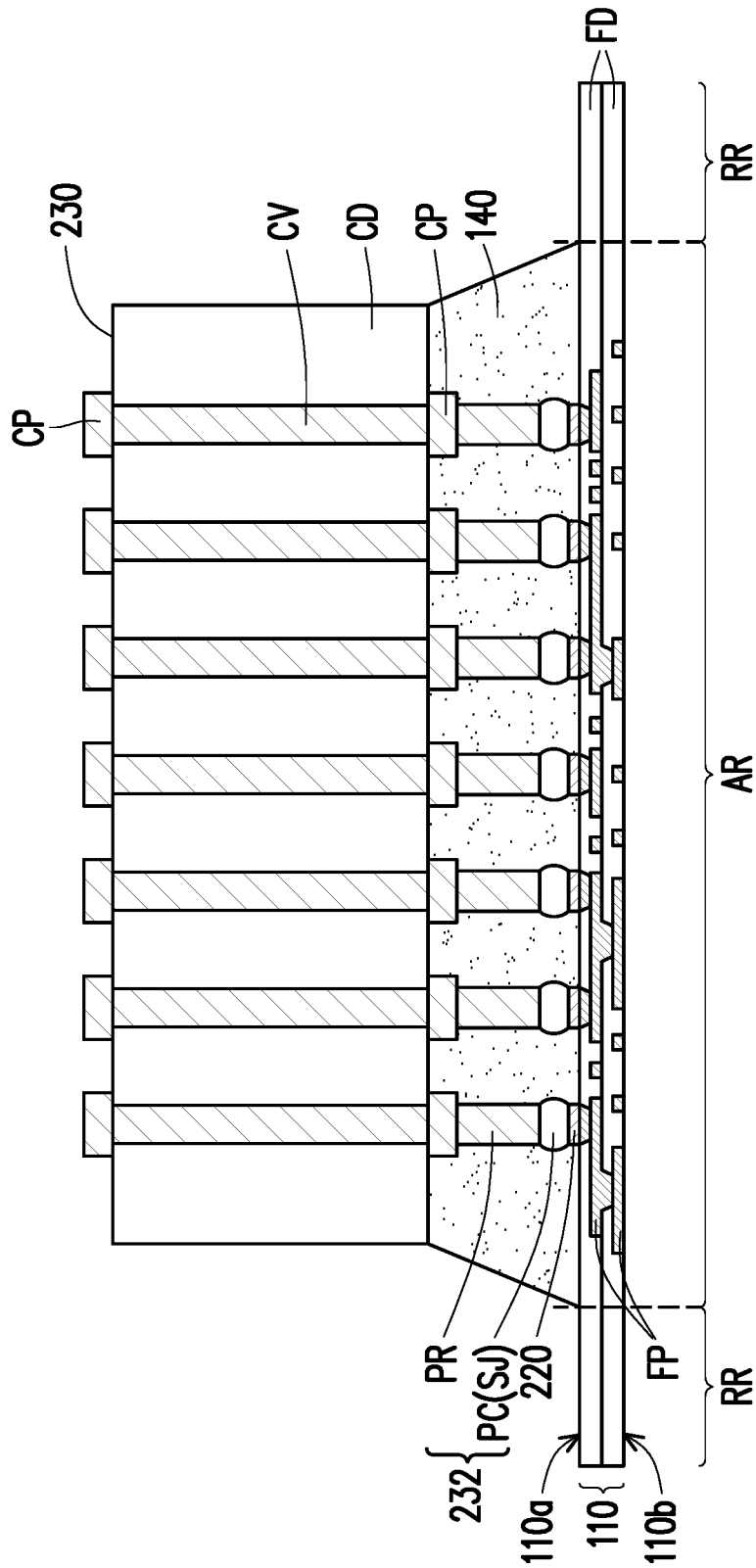
Figure 2G:
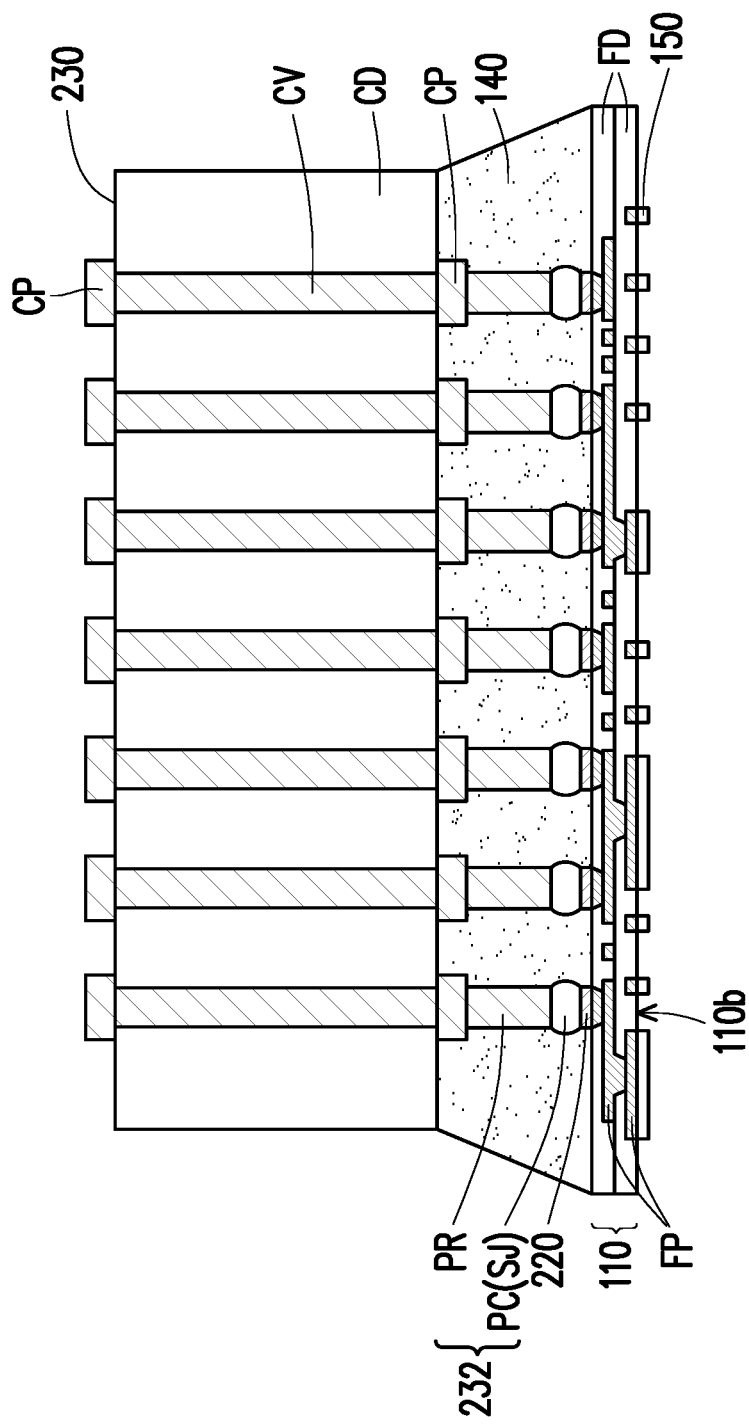

Referring to FIG. 2F and FIG. 2G, a portion of the thin-film redistribution structure 110 within the redundant region RR which is unmasked by the circuit substrate 230 and/or the underfill layer 140 may be removed. The removal process of the thin-film redistribution structure 110 may be similar to the process described in FIG. 1H, so the detailed descriptions are not repeated. Subsequently, the surface finishing layer 150 is optionally formed on the fine conductive pattern FP distributed on the second surface 110b of the thin-film redistribution structure 110 for protection and/or solderability. The formation of the surface finishing layer 150 may be similar to the process described in FIG. 1J, so the detailed descriptions are not repeated. Up to here, the fabrication of an integrated substrate structure 20 is substantially complete. The difference between the integrated substrate structure 20 and the integrated substrate structure 10 shown in FIG. 1J includes that the integrated substrate structure 20 includes conductive pads are formed as the conductive features 220 and the cap portions PC on the pillar portions PR of the conductive connectors 232 are reflowed to form the solder joints SJ connecting the pillar portions PR and the conductive features 220.

Figure 3A:
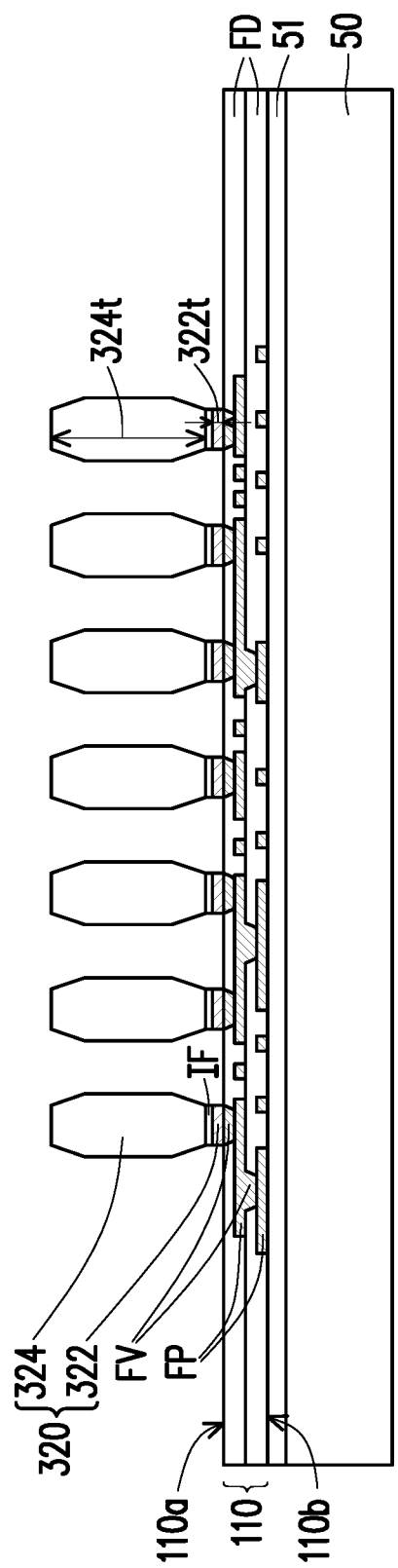
FIG. 3A to FIG. 3G are schematic cross-sectional views illustrating a manufacturing method of an integrated substrate structure according to some embodiments.

FIG. 3A to FIG. 3G are schematic cross-sectional views illustrating a manufacturing method of an integrated substrate structure according to some embodiments. The manufacturing method shown in FIGS. 3A-3G may be similar to the manufacturing methods described in FIGS. 1A-1J and FIGS. 2A-2G, the identical or similar numbers refer to the identical or similar elements throughout the drawings, and detail thereof is not repeated. Referring to FIG. 3A, the thin-film redistribution structure 110 including the fine conductive patterns FP and the fine conductive vias FV embedded in the fine dielectric layers FD may be formed over the temporary carrier 50. The release layer 51 may be interposed between the second surface 110b of the thin-film redistribution structure 110 and the temporary carrier 50. The formation of the thin-film redistribution structure 110 may be similar to the steps described in FIG. 1A-1B, so the detailed descriptions are not repeated.

After forming the thin-film redistribution structure 110, a plurality of conductive features 320 may be formed on the first surface 110a of the thin-film redistribution structure 110. The respective conductive feature 320 may include a pad portion 322 physically connected to the first surface 110a of the thin-film redistribution structure 110 and a bump portion 324 disposed over the pad portion 322. The thickness 324t of the bump portion 324 may be greater than the thickness 322t of the pad portion 322. The respective bump portion 324 may be an elongated shape extending along the thickness direction. For example, the respective bump portion 324 has a polygonal cross-sectional shape (e.g., octagonal cross-sectional shape). Other cross-sectional shape (e.g., rectangular shape, conical shape, ball shape, etc.) may be possible in other embodiments.

Continue to FIG. 3A, the pad portion 322 and/or the bump portion 324 may be or may include copper, gold, nickel, aluminium, platinum, tin, combinations thereof, an alloy thereof, or another suitable conductive material(s). In some embodiments, the pad portion 322 and the bump portion 324 are made of different conductive materials, where the pad portion 322 is a copper-containing pad and the bump portion 324 is a gold-containing bump. The bump portion 324 may be referred to as a gold stud bump in accordance with some embodiments. Although other metallic layers may be used to form the pads and bumps. In some embodiments, an intermetallic compound (IMC) is formed at the interface IF between the pad portion 322 and the bump portion 324. For example, if the pad portion 322 is coated with lead free solder and the bump portion 324 is made of gold, the IMC may be formed between the therebetween. The IMC may be uniform to form a stable bond between the pad portion 322 and the bump portion 324. Although the IMC may be non-uniform or may not be present depending on process recipes and/or materials of pad/bump. In other embodiments, the materials of the pad portion 322 and the bump portion 324 may be the same or similar.

Still referring to FIG. 3A, the pad portions 322 may be physically connected to the underlying fine conductive vias FV (or the fine conductive patterns FP in some other embodiments). The pad portions 322 and the fine conductive vias FV may be formed at the same plating step so that no significant interface forms between the pad portion 322 and the underlying fine conductive via FV. Alternatively, the fine conductive vias FV (or the fine conductive patterns FP) and the overlying pad portions 322 are formed separately at the sequential steps. In some embodiments, after forming the pad portions 322, each of the bump portions 324 is bonded to one of the pad portions 322. For example, a thermal treatment process (e.g., annealing) is performed on the interface IF to bond the bump portions 324 to the pad portions 322. Other suitable bonding process may be employed to bond the bump portions 324 to the pad portions 322.

Figure 3B:
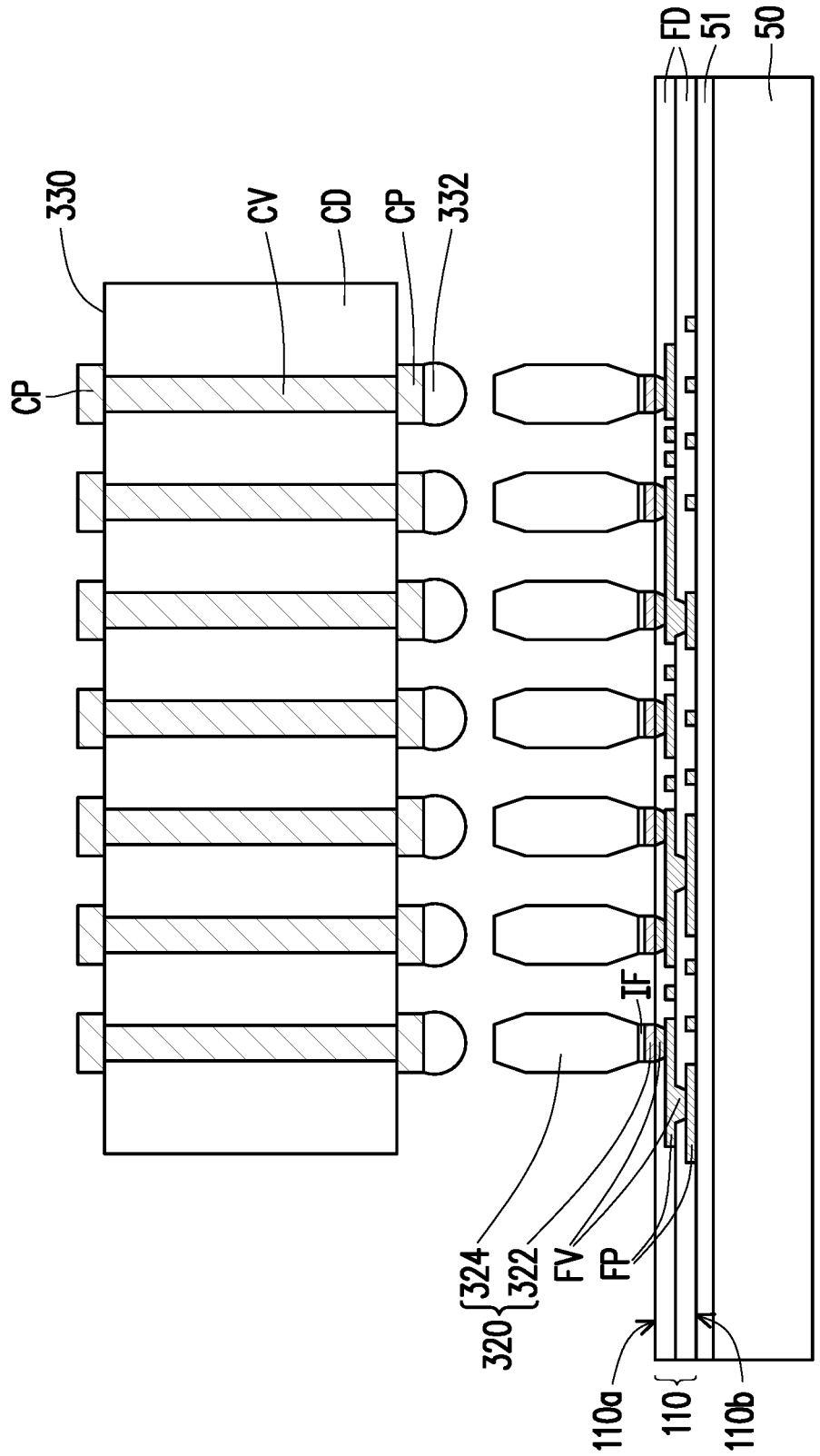

Referring to FIG. 3B, a circuit substrate 330 is provided. For example, the circuit substrate 330 and the thin-film redistribution structure 110 are separately fabricated. In some embodiments, the circuit substrate 330 is thicker and more rigid than the thin-film redistribution structure 110. The circuit substrate 330 may be similar to the circuit substrate 130 described in FIG. 1D, except that the circuit substrate 330 includes solder bumps 332 connected to the circuit pattern CP (e.g., conductive pads) at one side of the core layer CD.

Figure 3C:
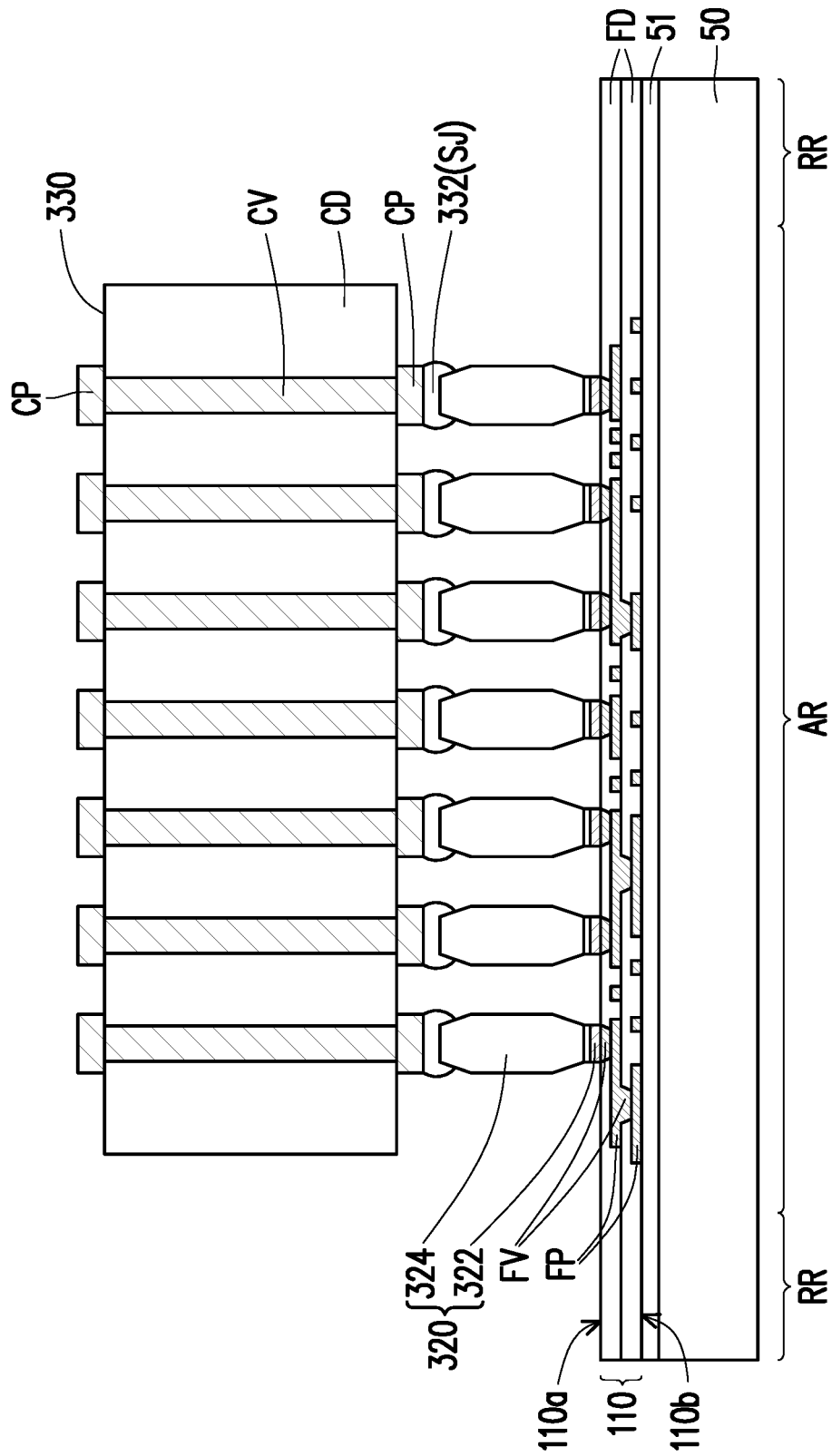

Referring to FIG. 3C and also FIG. 3B, the circuit substrate 330 may be disposed over the thin-film redistribution structure 110 and may be electrically coupled to the thin-film redistribution structure 110 through the conductive features 320 and the solder bumps 332. For example, a reflow process is performed on the solder bumps 332 to bond the circuit patterns CP of the circuit substrate 330 to the bump portions 324 of the conductive features 320. After the reflow and a curing process, the solder bumps 332 may be turned to solder joints SJ coupling the circuit substrate 330 and the conductive features 320. The respective bump portion 324 may be partially covered by the corresponding solder joint SJ. For example, the top of the respective bump portion 324 is inserted into the solder joint SJ. In some embodiments, the IMC may (or may not) form at the interface between the solder joint SJ and the corresponding bump portion 324. For example, the bump portion 324 that contains gold may provide a wettable surface for the solder bump 332 attachment. In some embodiments, the circuit substrate 330 is mounted within the active region AR of the thin-film redistribution structure 110, and the portion within the redundant region RR may be viewed as a sacrificial portion of the thin-film redistribution structure 110.

Figure 3D:
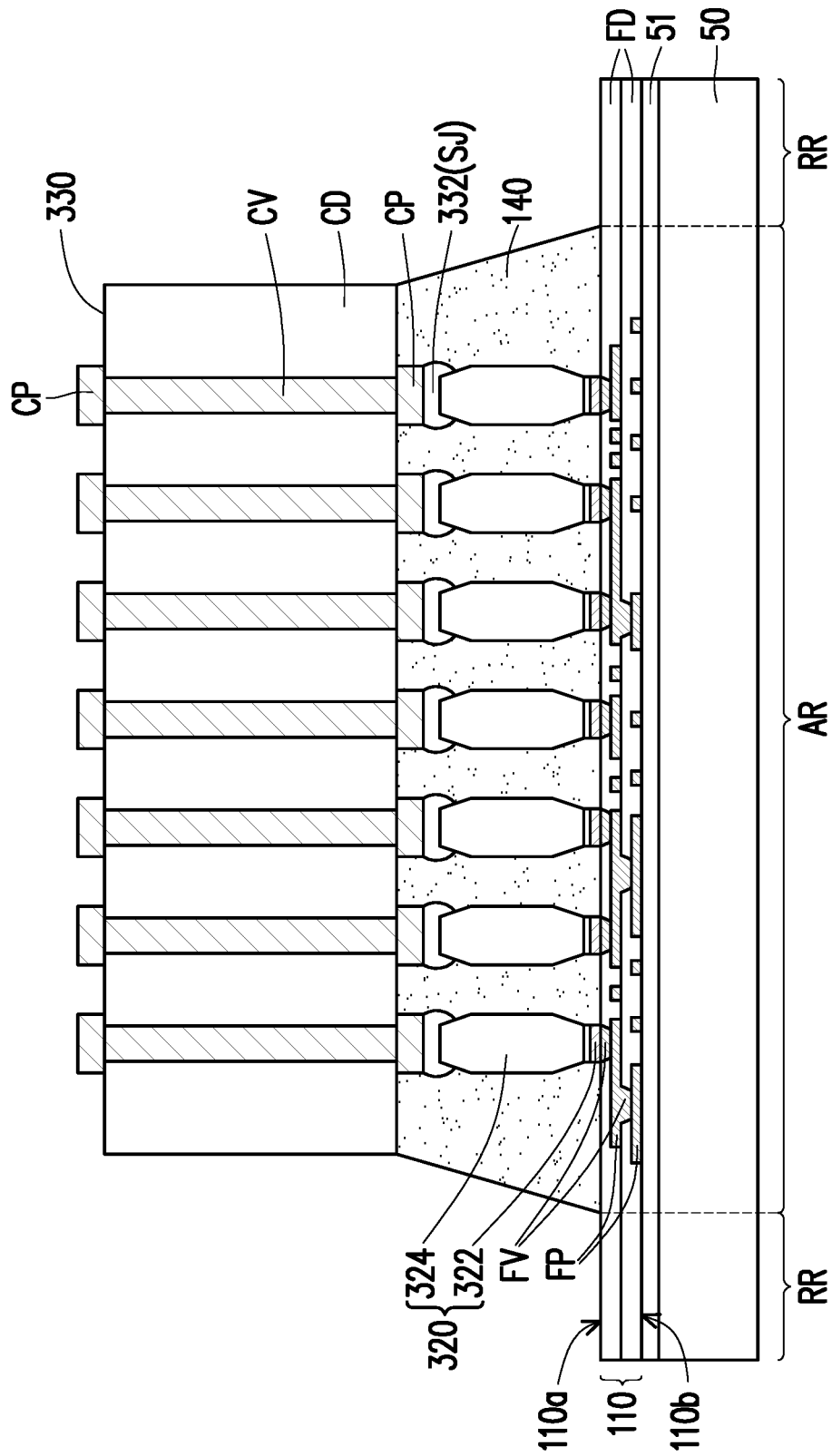

Referring to FIG. 3D, the underfill layer 140 may be formed between the thin-film redistribution structure 110 and the circuit substrate 330 to cover the conductive features 320 and/or the solder joint SJ for protection. For example, the underfill layer 140 fills the gap between the first surface 110a of the thin-film redistribution structure 110 and the bottom surface of the core layer CD to surround the conductive features 320, the solder joints SJ, and the circuit pattern CP bonded to the solder joints SJ. The formation of the underfill layer 140 may be similar to the process described in FIG. 1F, so the detailed descriptions are not repeated.

Figure 3E:
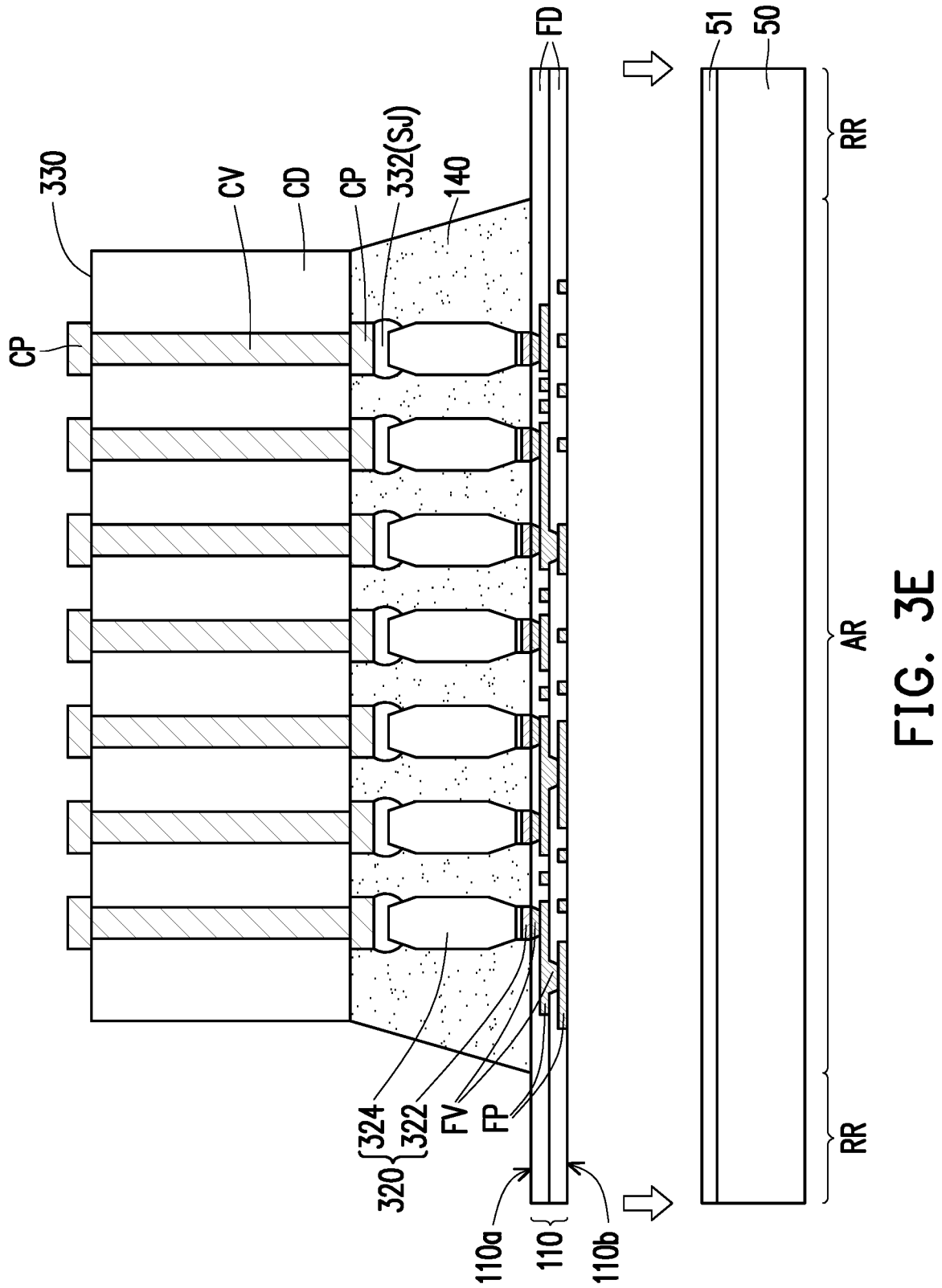

Referring to FIG. 3E, the temporary carrier 50 and the release layer 51 are removed from the thin-film redistribution structure 110 to expose the second surface 110b of the thin-film redistribution structure 110. For example, the bottommost level of the fine conductive patterns FP leveled with the fine dielectric layer FD on the second surface 110b may be revealed for further electrical connection. The debonding process of the temporary carrier 50 may be similar to the process described in FIG. 1G, so the detailed descriptions are not repeated.

Figure 3F:
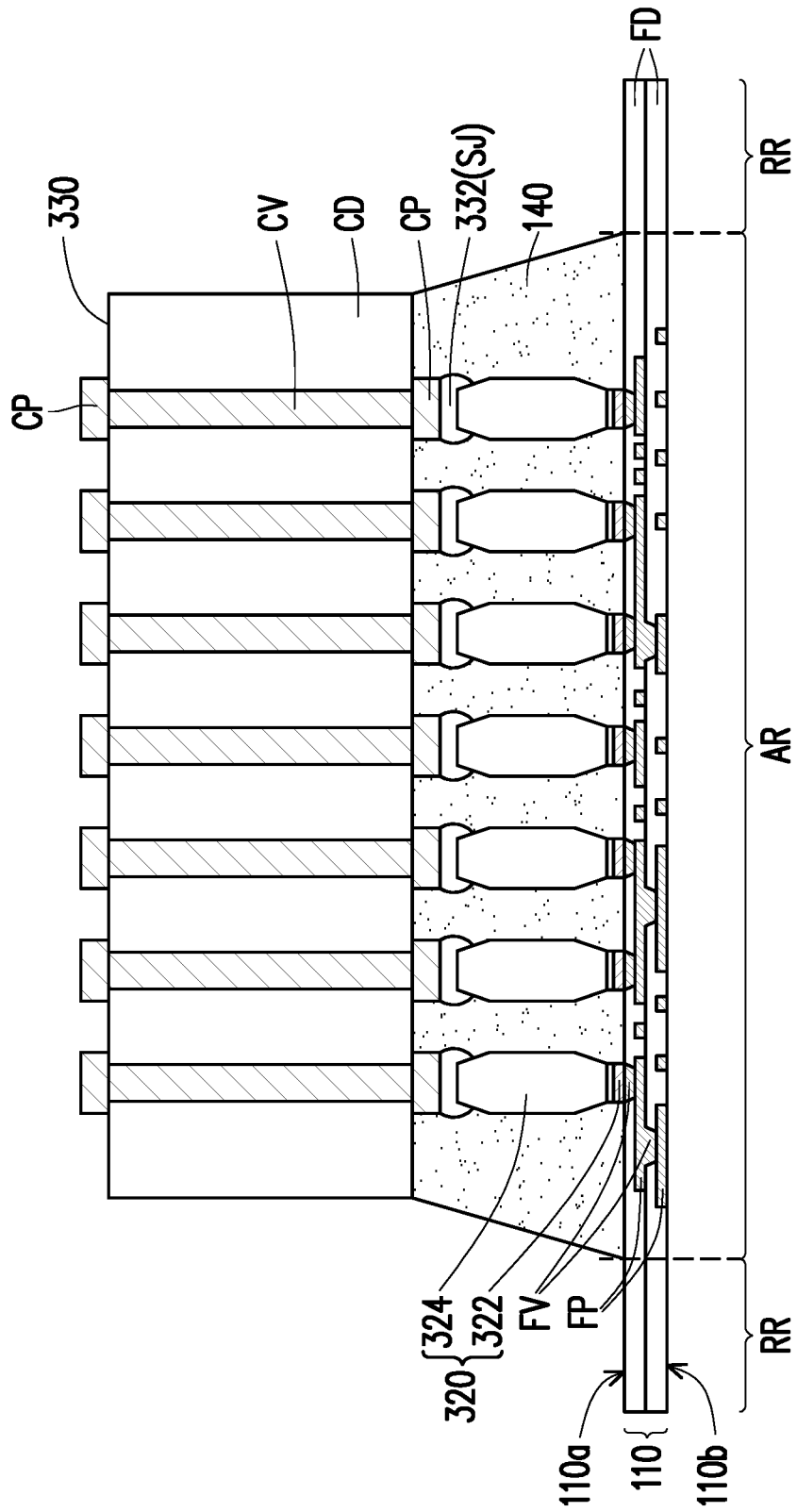
Figure 3G:
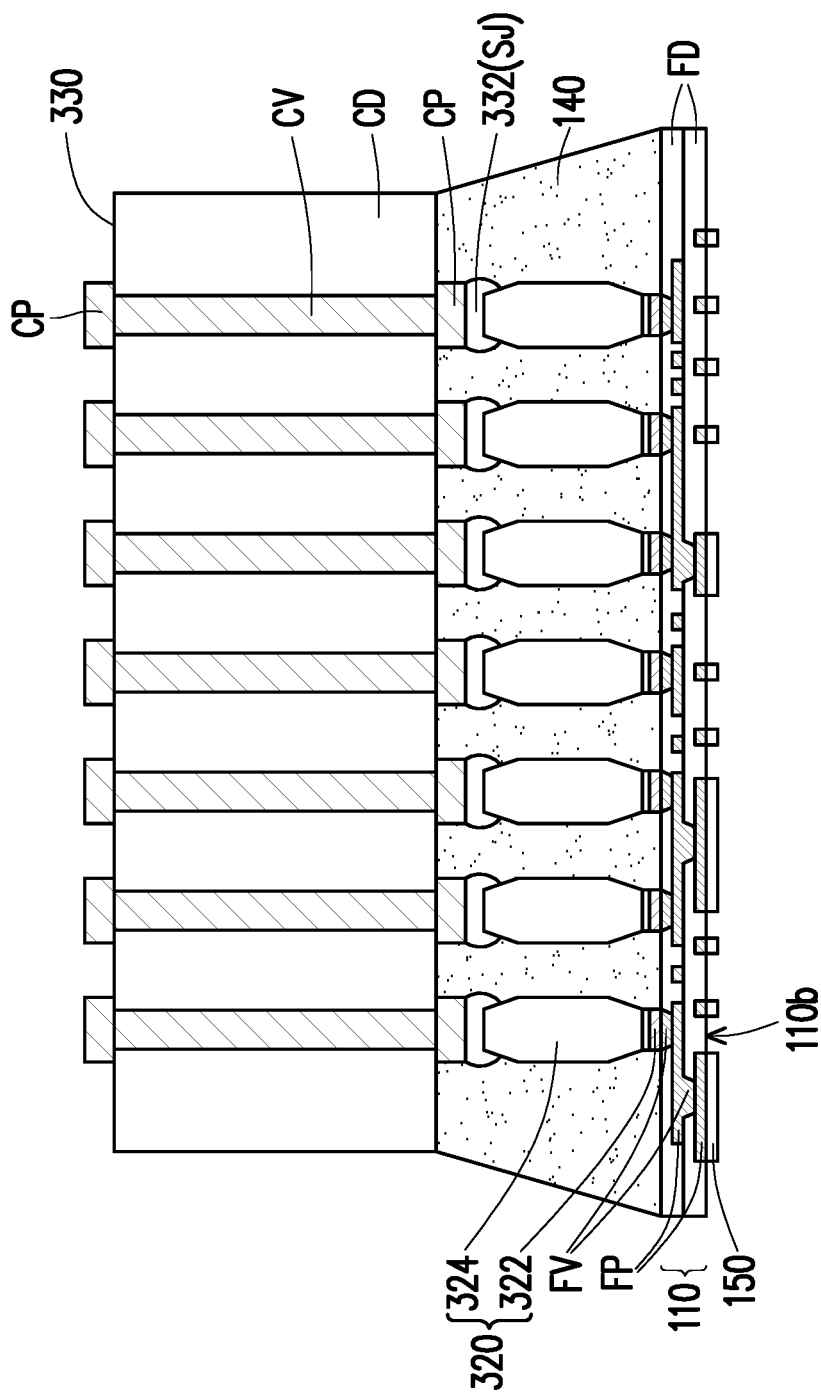

Referring to FIG. 3F and FIG. 3G, a portion of the thin-film redistribution structure 110 in the redundant region RR which is unmasked by the circuit substrate 330 and/or the underfill layer 140 may be removed. The removal process of the thin-film redistribution structure 110 may be similar to the process described in FIG. 1H, so the detailed descriptions are not repeated. Subsequently, the surface finishing layer 150 is optionally formed on the fine conductive pattern FP distributed on the second surface 110b of the thin-film redistribution structure 110 for protection and/or solderability. The formation of the surface finishing layer 150 may be similar to the process described in FIG. 1J, so the detailed descriptions are not repeated. Up to here, the fabrication of an integrated substrate structure 30 is substantially complete. The difference between the integrated substrate structure 30 and the integrated substrate structure 20 shown in FIG. 2G includes that the conductive features 320 of the integrated substrate structure 30 includes the pad portions 322 and the bump portions 324 disposed thereon and the solder bumps 332 provided with the circuit substrate 330 are reflowed to form solder joints SJ connecting the bump portions 324 and the circuit pattern CP of the circuit substrate 330.

Figure 4A:
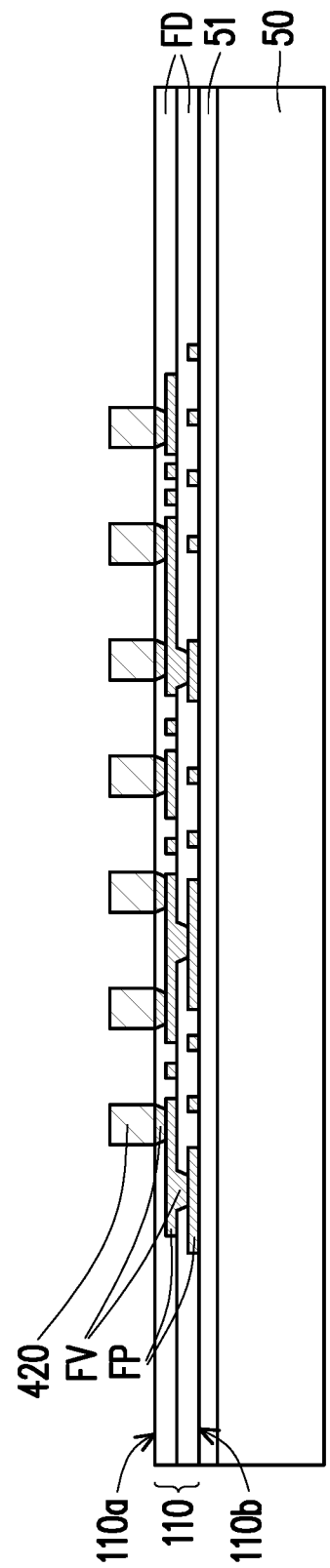
FIG. 4A to FIG. 4F are schematic cross-sectional views illustrating a manufacturing method of an integrated substrate structure according to some embodiments.

FIG. 4A to FIG. 4F are schematic cross-sectional views illustrating a manufacturing method of an integrated substrate structure according to some embodiments. The manufacturing method shown in FIGS. 4A-4F may be similar to the manufacturing methods described in FIGS. 1A-1J and FIGS. 2A-2G, the identical or similar numbers refer to the identical or similar elements throughout the drawings, and detail thereof is not repeated. Referring to FIG. 4A, the thin-film redistribution structure 110 including the fine conductive patterns FP and the fine conductive vias FV embedded in the fine dielectric layers FD may be formed over the temporary carrier 50. The release layer 51 may be interposed between the second surface 110b of the thin-film redistribution structure 110 and the temporary carrier 50. The formation of the thin-film redistribution structure 110 may be similar to the step described in FIG. 1A-1B, so the detailed descriptions are not repeated.

After forming the thin-film redistribution structure 110, a plurality of conductive features 420 may be formed on the first surface 110a of the thin-film redistribution structure 110. The conductive features 420 may be or may include conductive pads (or conductive pillars) that are physically connected to the underlying fine conductive vias FV (or the fine conductive patterns FP in some embodiments). The material(s) of the conductive features 420 may be or may include copper, gold, nickel, aluminium, platinum, tin, combinations thereof, an alloy thereof, or another suitable conductive material. The materials of the conductive features 420 may be the same or similar to that of the fine conductive vias FV. In some embodiments, the respective conductive feature 420 formed on the fine conductive via FV at the same plating step. Alternatively, the fine conductive vias FV and the overlying conductive features 420 are formed separately at the sequential steps. In some embodiments, the respective conductive feature 420 has a height ranging from about 5 μm to about 100 μm. Although other values may be possible depending on product requirements/process recipes.

Figure 4B:
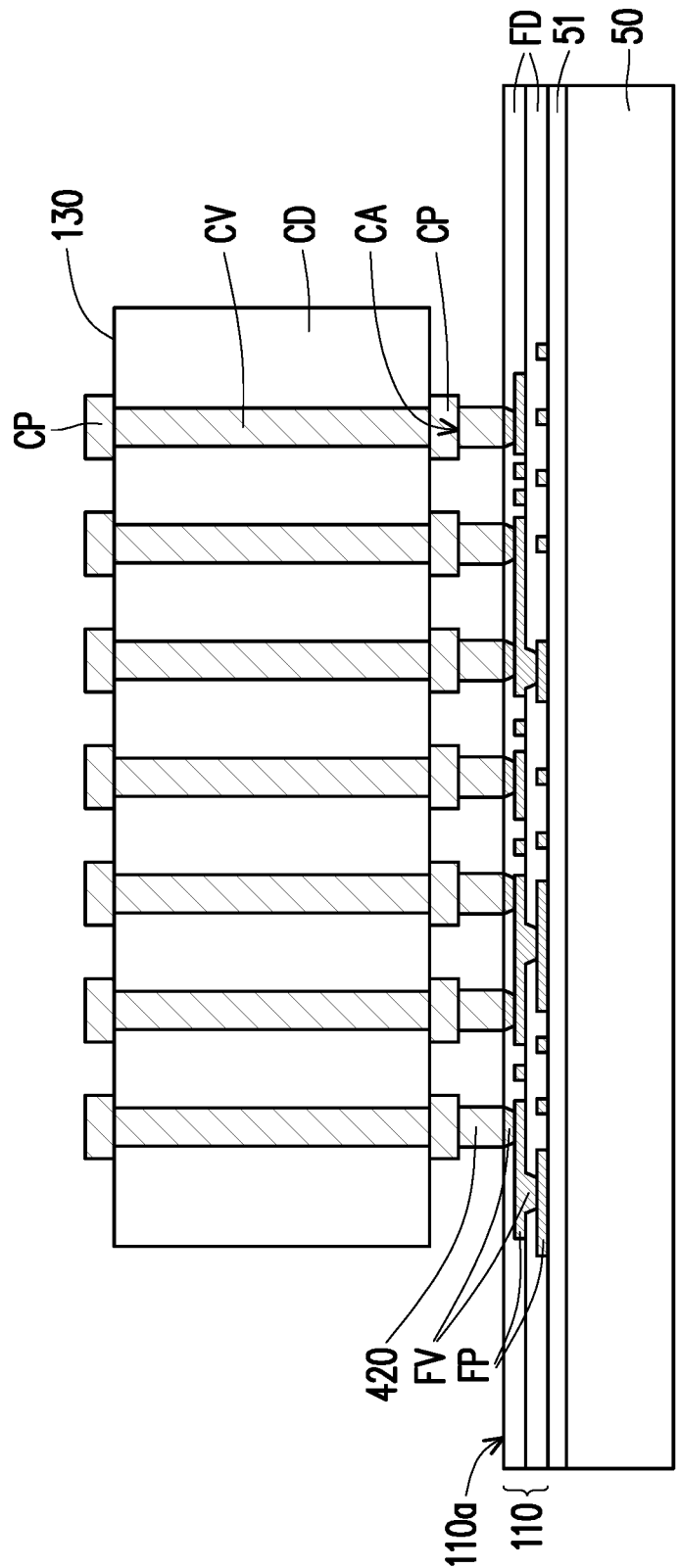

Referring to FIG. 4B, the circuit substrate 130 is provided and then coupled to the thin-film redistribution structure 110 through the conductive features 420. The circuit substrate 130 may be the same as the circuit substrate 130 described in FIG. 1D, so the detailed descriptions are not repeated. In some embodiments, the circuit substrate 130 is disposed on the conductive features 420, where the circuit pattern CP at the bottom side of the core layer CD are aligned and physically connected to the conductive features 420. The circuit pattern CP facing the thin-film redistribution structure 110 may be or may include conductive pads, and each of the conductive pads corresponds to one of the conductive features 420 (e.g., conductive pillars or pads) 420. Next, after placing the circuit substrate 130 on the conductive features 420, a bonding process may be performed to bond the circuit substrate 130 to the conductive features 420.

In some embodiments, before bonding, the bonding surfaces of the circuit pattern CP and the conductive features 420 may be cleaned, and then the circuit pattern CP and the conductive features 420 may be precisely aligned and bonded together, at elevated temperatures and/or under pressure, to form individual electrical and mechanical interconnections between the circuit substrate 130 and the thin-film redistribution structure 110. For example, the circuit pattern CP and the conductive features 420 are made of copper, and the copper-to-copper bonding is performed. Although the circuit pattern CP and/or the conductive features 420 may include other conductive material(s), and a direct metal-to-metal bonding may also be employed. In some embodiments, the circuit pattern CP and the conductive features 420 are bonded at a low temperature (e.g., about 300° C. or lower than 300° C.). Alternatively, the circuit pattern CP and the conductive features 420 may be bonded at a high temperature (e.g., greater than 300° C.). In some embodiments, a pressure may be applied during the bonding. Since the circuit pattern CP is directly bonded to the conductive features 420, no solder material is formed therebetween.

Continue to FIG. 4B, the circuit pattern CP (e.g., conductive pad) may have the surface area greater than the surface area of the corresponding conductive feature (e.g., conductive pillar or pad) 420. After bonding the circuit substrate 130 to the conductive features 420, the contact area CA of the circuit pattern CP and the corresponding conductive feature 420 may be equal to the bonding surface area of the corresponding conductive feature 420. A portion of the surface area of the circuit pattern CP (e.g., conductive pad) may be exposed by the corresponding conductive feature 420. In other embodiments, the surface area of the circuit pattern CP (e.g., conductive pad) is substantially equal to that of the corresponding conductive feature (e.g., conductive pillar or pad) 420. Under this scenario, the contact area may be substantially equal to the surface areas of the circuit pattern CP and the corresponding conductive feature 420 after precise bonding. Alternatively, the surface area of the circuit pattern CP (e.g., conductive pad) may be less than that of the corresponding conductive feature (e.g., conductive pillar or pad) 420. Under this scenario, the contact area may be equal to the bonding surface area of the circuit pattern CP.

Figure 4C:
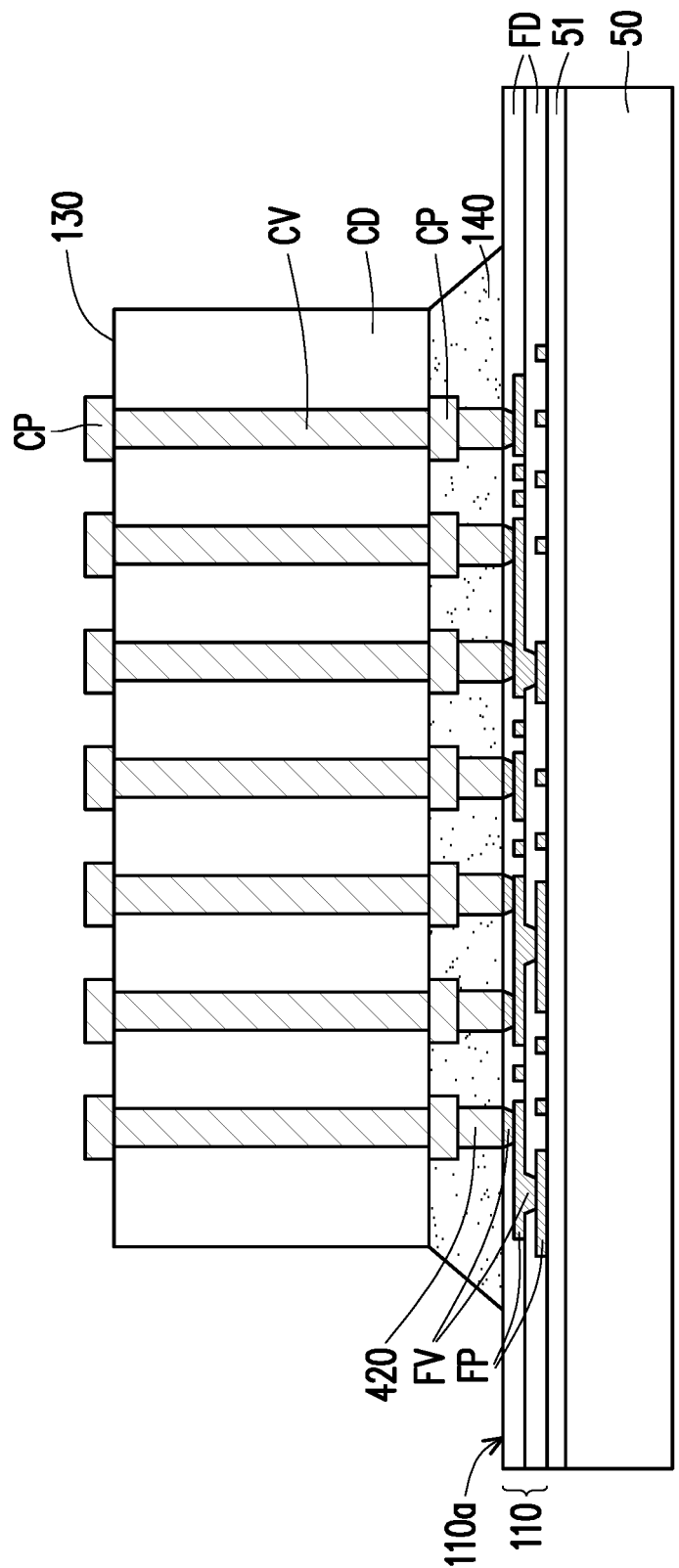

Referring to FIG. 4C, the underfill layer 140 may be formed between the thin-film redistribution structure 110 and the circuit substrate 130 to cover the conductive features 420 and the circuit pattern CP for protection. For example, the underfill layer 140 fills the gap between the first surface 110a of the thin-film redistribution structure 110 and the bottom surface of the core layer CD to surround the conductive features 420 and the circuit pattern CP. In some embodiments where the surface area of the circuit pattern CP is greater than that of the corresponding conductive feature 420, the portion of the circuit pattern CP unmasked by the conductive features 420 may be in physical contact with the underfill layer 140. The formation of the underfill layer 140 may be similar to the process described in FIG. 1F, so the detailed descriptions are not repeated.

Figure 4D:
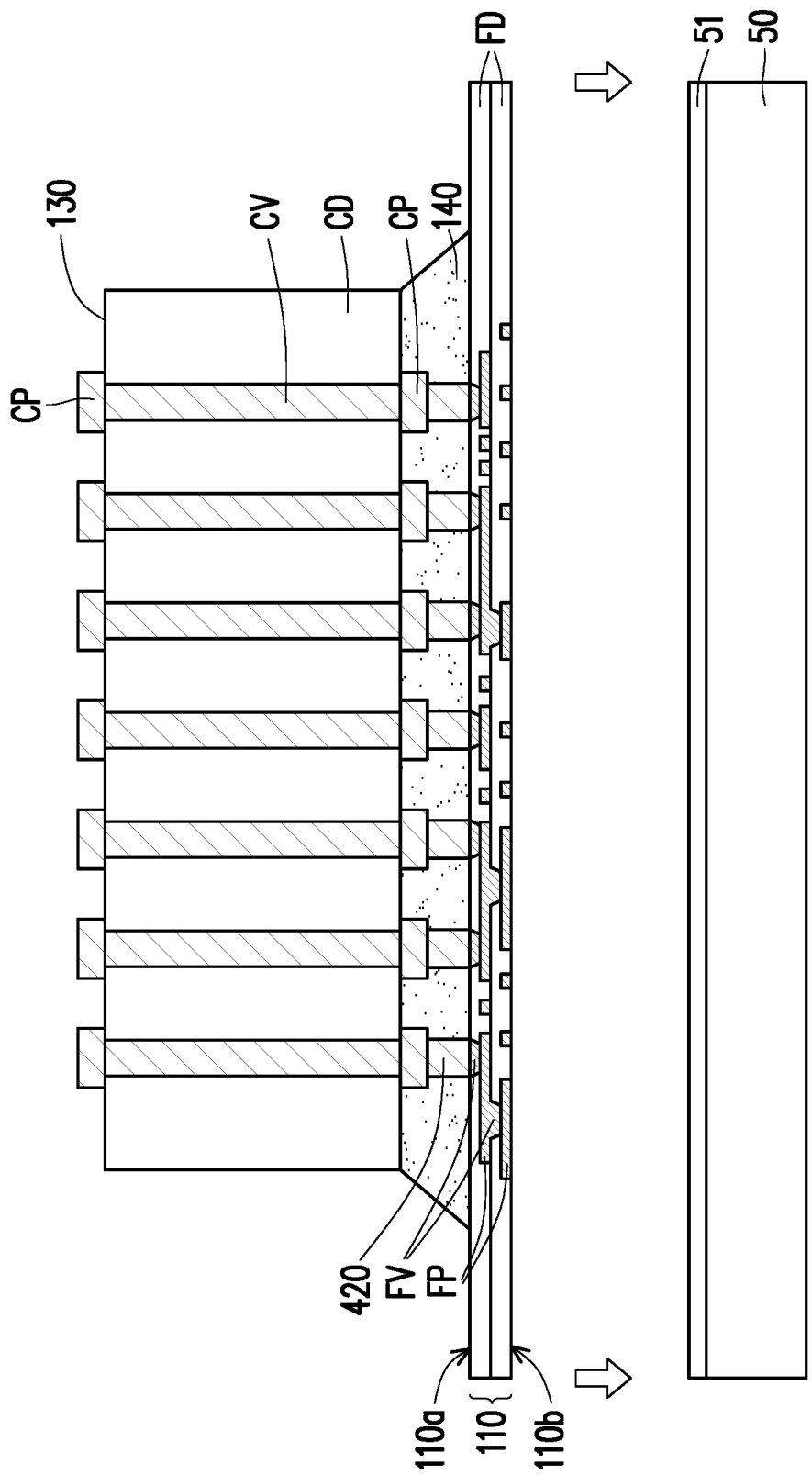

Referring to FIG. 4D, the temporary carrier 50 and the release layer 51 are removed from the thin-film redistribution structure 110 to expose the second surface 110b of the thin-film redistribution structure 110. For example, the bottommost level of the fine conductive patterns FP leveled with the fine dielectric layer FD on the second surface 110b may be revealed for further electrical connection. The de-bonding process of the temporary carrier 50 may be similar to the process described in FIG. 1G, so the detailed descriptions are not repeated.

Figure 4E:
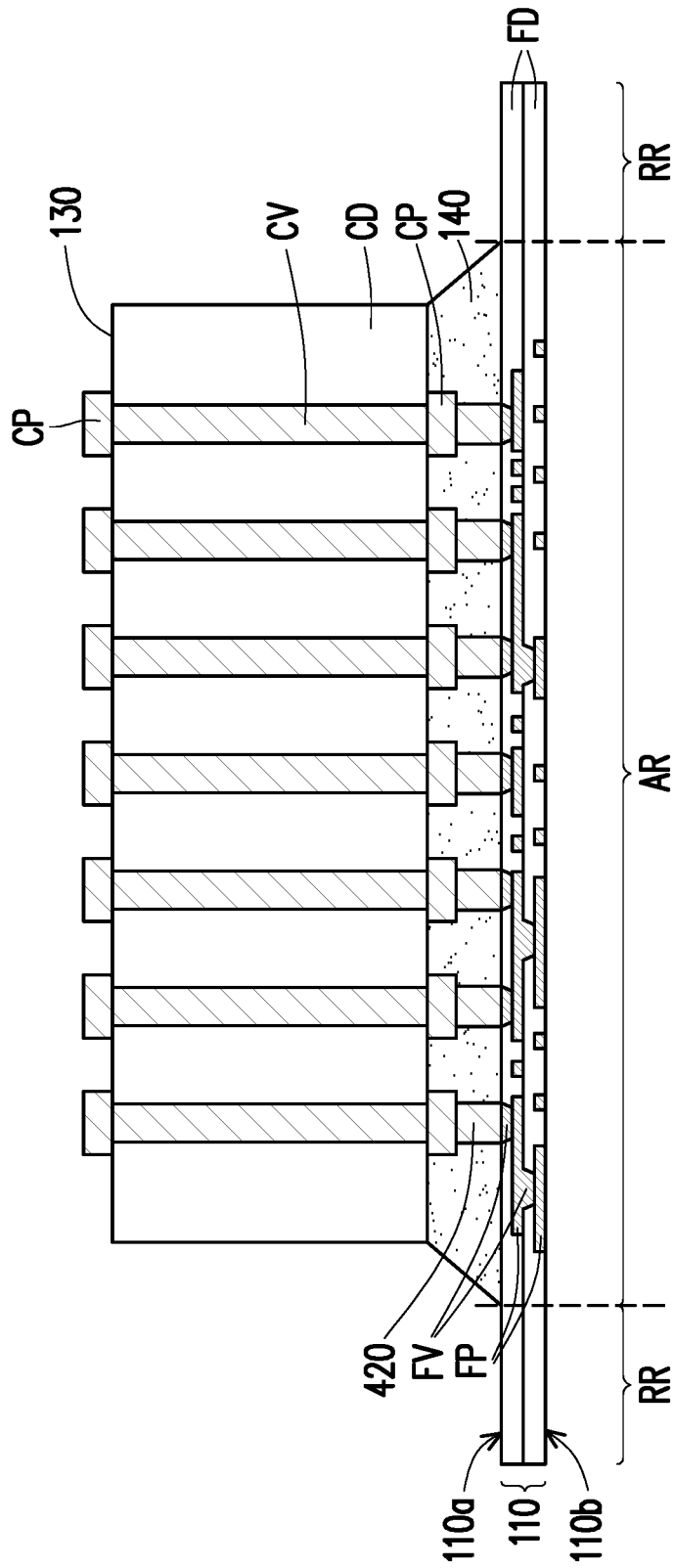
Figure 4F:
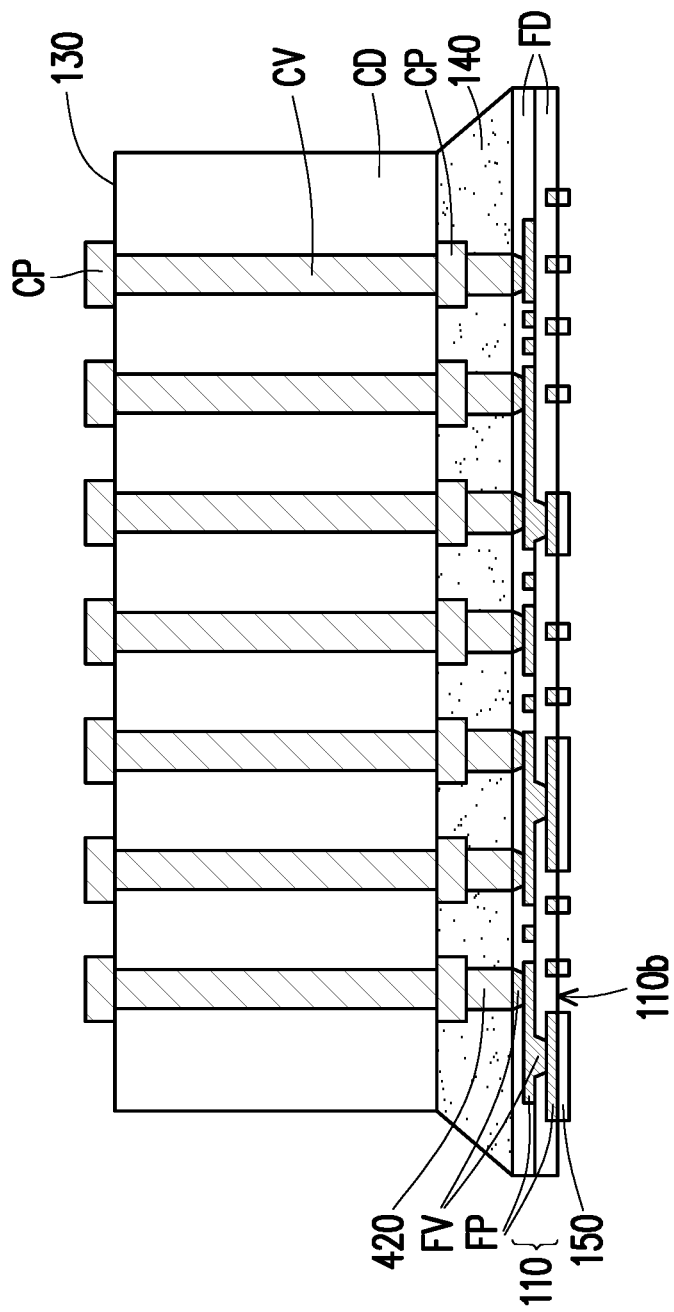

Referring to FIGS. 4E-4F, a portion of the thin-film redistribution structure 110 in the redundant region RR which is not covered by the circuit substrate 130 and/or the underfill layer 140 may be removed, and thus only a portion of the thin-film redistribution structure 110 in the active region AR is remained. The removal process of the thin-film redistribution structure 110 may be similar to the process described in FIG. 1H, so the detailed descriptions are not repeated. Subsequently, the surface finishing layer 150 is optionally formed on the fine conductive pattern FP distributed on the second surface 110b of the thin-film redistribution structure 110 for protection and/or solderability. The formation of the surface finishing layer 150 may be similar to the process described in FIG. 1J, so the detailed descriptions are not repeated. Up to here, the fabrication of an integrated substrate structure 40 is substantially complete as shown in FIG. 4F. The difference between the integrated substrate structure 40 and the integrated substrate structure 10 shown in FIG. 1J includes that a direct metal-to-metal bonding is performed to bond the circuit substrate 130 to the conductive features 420, and the integrated substrate structure 40 may be free of solder material.

Figure 5:
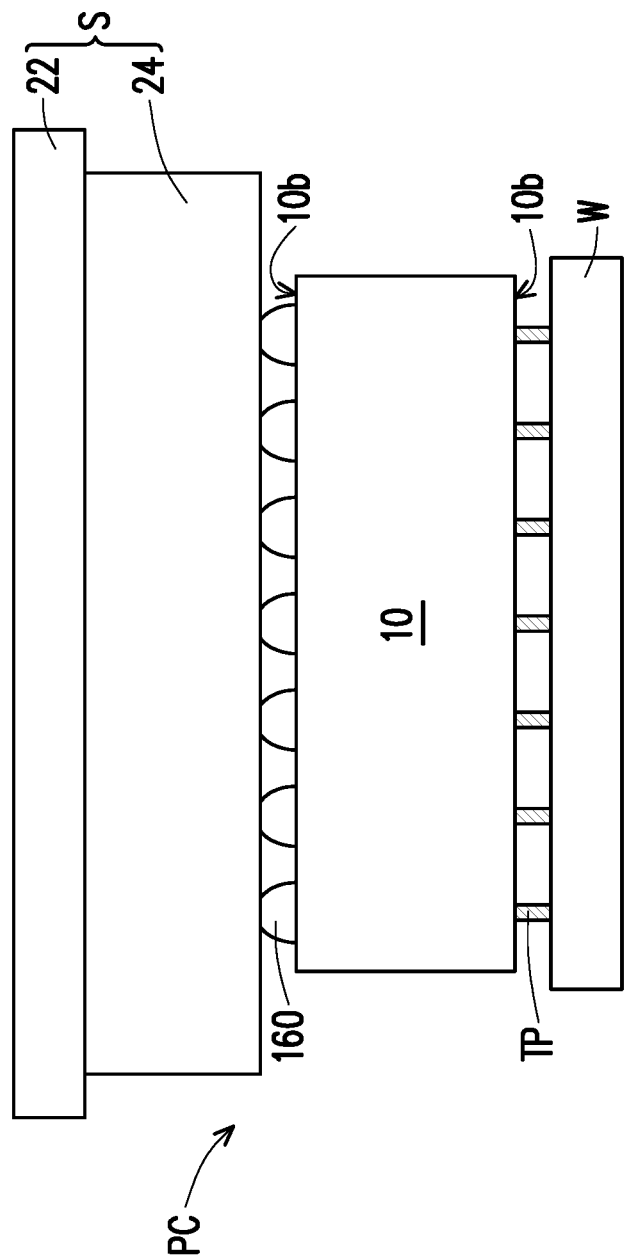
FIG. 5 is a schematic cross-sectional view illustrating a testing system including an integrated substrate structure for testing a semiconductor wafer according to some embodiments.

FIG. 5 is a schematic cross-sectional view illustrating a testing system including an integrated substrate structure for testing a semiconductor wafer according to some embodiments. The identical or similar numbers refer to the identical or similar elements throughout the drawings, and detail thereof is not repeated. Referring to FIG. 5 and also FIG. 1J, a testing system PC a probe card for probing and testing a semiconductor wafer W. For example, the testing system PC includes the integrated substrate structure 10 with a plurality of testing tips TP mounted thereon, and a signal source carrier S disposed on and coupled to the integrated substrate structure 10. For example, the integrated substrate structure 10 may be used as a space transformer for testing the semiconductor wafer W. The integrated substrate structure 10 may also provide a high bandwidth and low latency scheme for probing the semiconductor wafer W to be tested. For example, the integrated substrate structure 10 includes a terminal side 10a and a probe side 10b opposite to each other, where the conductive terminals 160 may be distributed at the terminal side 10a and electrically connected to the signal source carrier S, and the testing tips TP may be distributed at the probe side 10b and faces the semiconductor wafer W to be tested. For example, the testing tips TP provided with fine-pitch (and line/spacing) may be in direct contact with the testing pads (not shown) of the semiconductor wafer W during electrical testing.

Continue to FIG. 5 and FIG. 1J, the conductive terminals 160 are formed on the circuit pattern (e.g., conductive pads) CP at the top side of the core layer CD that is opposite to the circuit pattern CP connected to the conductive features 120. The conductive terminals 160 may be or may include solder balls, BGA, or other suitable terminals for electrical connection. The testing tips TP may be formed over the fine conductive pattern FP at the second surface 110b or may be formed directly on the surface finishing layer 150 in accordance with some embodiments. Turning back to FIG. 5, the signal source carrier S may include a stiffener 22 and a testing PCB 24 carried by the stiffener 22. The testing PCB 24 may serve as the signal source for providing the signal. The terminal side 10a of the integrated substrate structure 10 may face the testing PCB 24, and the conductive terminals 160 at the terminal side 10a of the integrated substrate structure 10 may be physically and electrically connected to the testing PCB 24. The signal from the testing PCB 24 may be transmitted to the semiconductor wafer W through the integrated substrate structure 10.

In some embodiments, the integrated substrate structure 10 disposed between the signal source carrier S and the semiconductor wafer W to be tested serves as a space transformer, since the integrated substrate structure 10 includes the fine redistribution circuitry (e.g., fine conductive patterns FP and fine conductive vias FV) of the thin-film redistribution structure 110 connected to the testing tips TP, and the coarse redistribution circuitry (e.g., circuit patterns CP and through vias CV) of the circuit substrate 130 connected to the conductive terminals 160. It is noted that resistance and capacitance is dependent on the length of the wiring for shorter lengths, RC delay is reduced. The integrated substrate structure 10 provides the interconnection including the fine redistribution circuitry and the coarse redistribution circuitry and having small RC delay. It should be noted that the testing system PC illustrated in FIG. 5 is merely for illustrative purpose, and additional elements may be disposed in the testing system PC. It is also noted that the integrated substrate structure 10 in the testing system PC may be replaced with any variation of the integrated substrate structure (e.g., the integrated substrate structure 20 shown in FIG. 2G, the integrated substrate structure 30 shown in FIG. 3G, or the integrated substrate structure 40 shown in FIG. 4F) discussed in the disclosure.

Figure 6C:
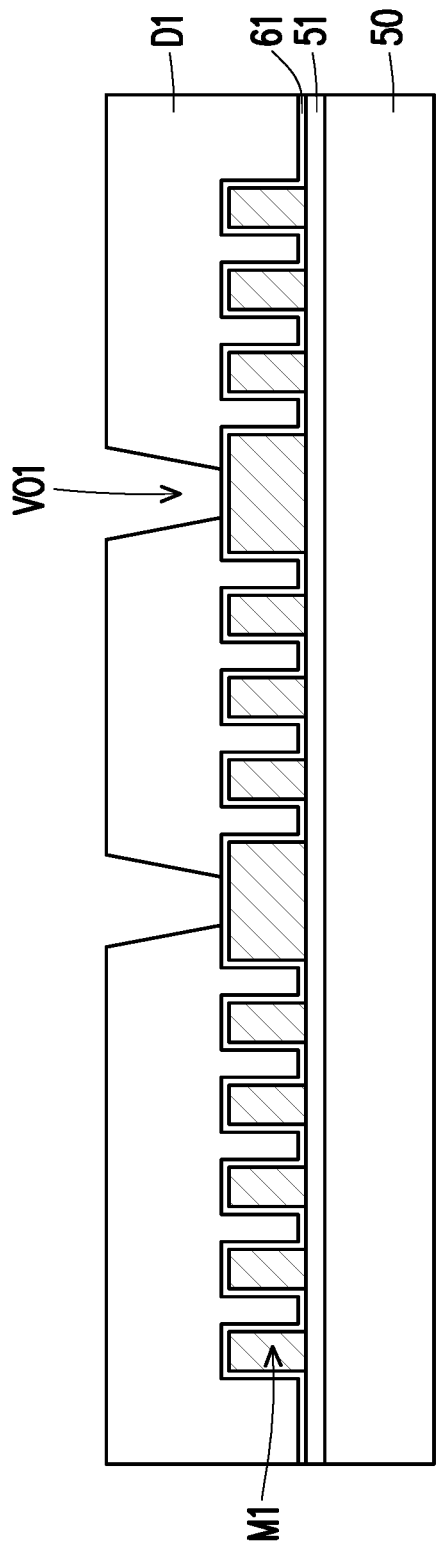

FIG. 6A to FIG. 6I are schematic cross-sectional views illustrating a manufacturing method of a redistribution structure having fine circuitry according to some embodiments. The identical or similar numbers refer to the identical or similar elements throughout the drawings, and detail thereof is not repeated. Referring to FIG. 6A, a conductive pattern M1 at the first level is formed over the temporary carrier 50. The release layer 51 is optionally interposed between the conductive pattern M1 and the temporary carrier 50 to enhance the releasability of the subsequently formed structure from the temporary carrier 50 in a subsequent de-bonding process (if desired).

In some embodiments, forming the conductive pattern M1 at least includes the following steps. A seed layer (not shown) may be formed over the temporary carrier 50, where the seed layer may include copper, titanium, a combination thereof, etc., and the seed layer may be formed by deposition, plating, sputtering, or other suitable process. Next, a photoresist layer with openings (not shown) may be formed on the seed layer, and then conductive material (e.g., copper, gold, nickel, aluminium, platinum, tin, an alloy thereof, or the like) may be formed in the openings of the photoresist layer to be plated on the seed layer. Subsequently, the photoresist layer may be removed and those portions of the seed layer that are not covered by the conductive materials may be removed. The rest portions of the seed layer and the conductive materials formed thereon may be collectively viewed as the conductive pattern M1.

Referring to FIG. 6B, a dielectric liner 61 may be conformally formed over the temporary carrier 50 to cover the conductive pattern M1. The dielectric liner 61 may be or may include silicon nitride (SiN), silicon dioxide ($SiO_2$), or the like. In some embodiments, the dielectric liner 61 is formed by atomic layer deposition (ALD). ALD may be performed with a low thermal budget. The dielectric liner 61 may be thin and uniform, since ALD may provide good conformity to the surfaces on which the material is deposited. In addition, the dielectric liner 61 formed by ALD may achieve very high uniformity in the thickness across the entire surface on which material is deposited. In some embodiments, the thickness of the dielectric liner 61 ranges from about 50 nm (0.05 µm) to about 500 nm (0.5 µm). Other deposition process (e.g., CVD or the like) may be used to form the dielectric liner 61 in other embodiments.

Referring to FIG. 6C, a patterned dielectric layer D1 at the first level may be formed over the temporary carrier 50 to cover the dielectric liner 61 which overlie the conductive pattern M1. In some embodiments, the patterned dielectric layer D1 includes passivation material. The patterned dielectric layer D1 may (or may not) be photo-sensitive. For example, the patterned dielectric layer D1 includes photo-sensitive polyimide (PSPI) or other suitable insulating material(s). The patterned dielectric layer D1 may be thick enough to embed the conductive pattern M1 and the dielectric liner 61 therein. The thickness of the patterned dielectric layer D1 may be from about 1 µm to about 10 µm, although lesser and greater thicknesses are also contemplated herein.

In some embodiments, the patterned dielectric layer D1 includes via openings VO1 exposing at least a portion of the underlying dielectric liner 61 that corresponds to the conductive pattern M1. For example, the via openings VO1 is formed by lithographic methods (e.g., exposure and development). In other embodiments, the patterned dielectric layer D1 includes non-photosensitive material, and a photoresist layer (not shown) may be applied and patterned, and the pattern in the photoresist layer is transferred by etching so as to form the via openings VO1, and the photoresist layer is subsequently removed. Other suitable patterning or deposition processes may be used to form the patterned dielectric layer D1. During the formation of the via openings VO1, the underlying dielectric liner 61 is not removed to protect the conductive pattern M1. In some embodiments, the respective via opening VO1 is tarped toward the dielectric liner 61. Alternatively, the inner sidewalls of the patterned dielectric layer D1 that define the via openings VO1 are vertical relative to the top surface of the dielectric liner 61.

Figure 6D:
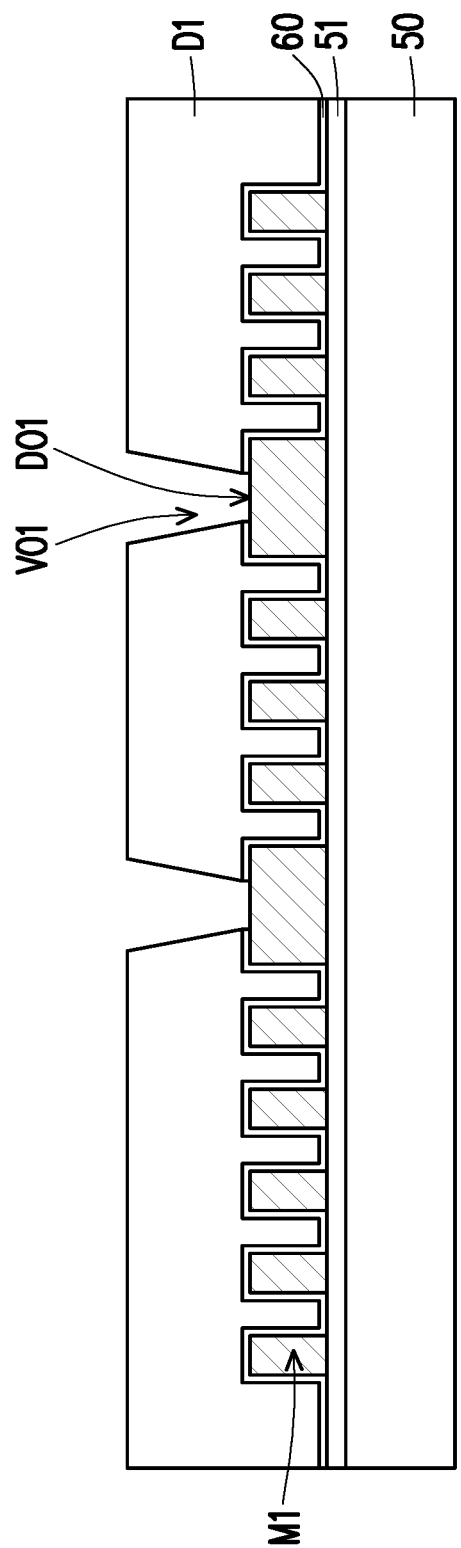

Referring to FIG. 6D, the portion of the dielectric liner 61 which is exposed by the via openings VO1 of the patterned dielectric layer D1 may be removed to form the patterned dielectric liner 60 having openings DO1 exposing the underlying conductive pattern M1 for further electrical connection. That is, a portion of the conductive pattern M1 may be exposed by the via openings VO1 of the patterned dielectric layer D1 and the corresponding openings DO1 of the patterned dielectric liner 60. For example, the openings DO1 are formed by etching or other suitable removal process.

Figure 6E:
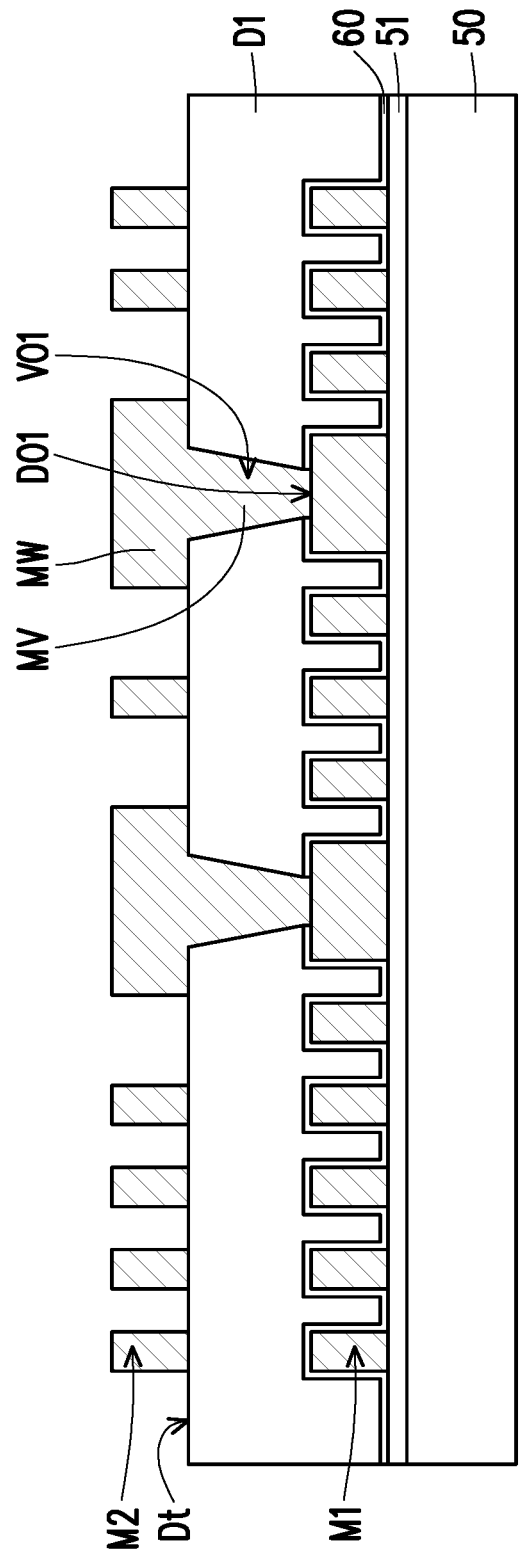

Referring to FIG. 6E, a conductive pattern M2 at the second level is formed on the top surface Dt of the patterned dielectric layer D1 and inside the via openings VO1 and the corresponding openings DO1. The formation of the conductive pattern M2 may be similar to that of the conductive pattern M1, so the detailed descriptions are simplified. In some embodiments, the conductive pattern M2 includes via portions MV located in the via openings VO1 to be in direct contact with the top surface of the conductive pattern M1 at the first level. The via portions MV may be laterally covered by the patterned dielectric layer D1 and the patterned dielectric liner 60. The conductive pattern M2 may also include wiring portions MW disposed on the top surface Dt of the patterned dielectric layer D1. A part of the wiring portions MW may be directly connected to the via portions MV and may be referred to as the pad portions.

Figure 6F:
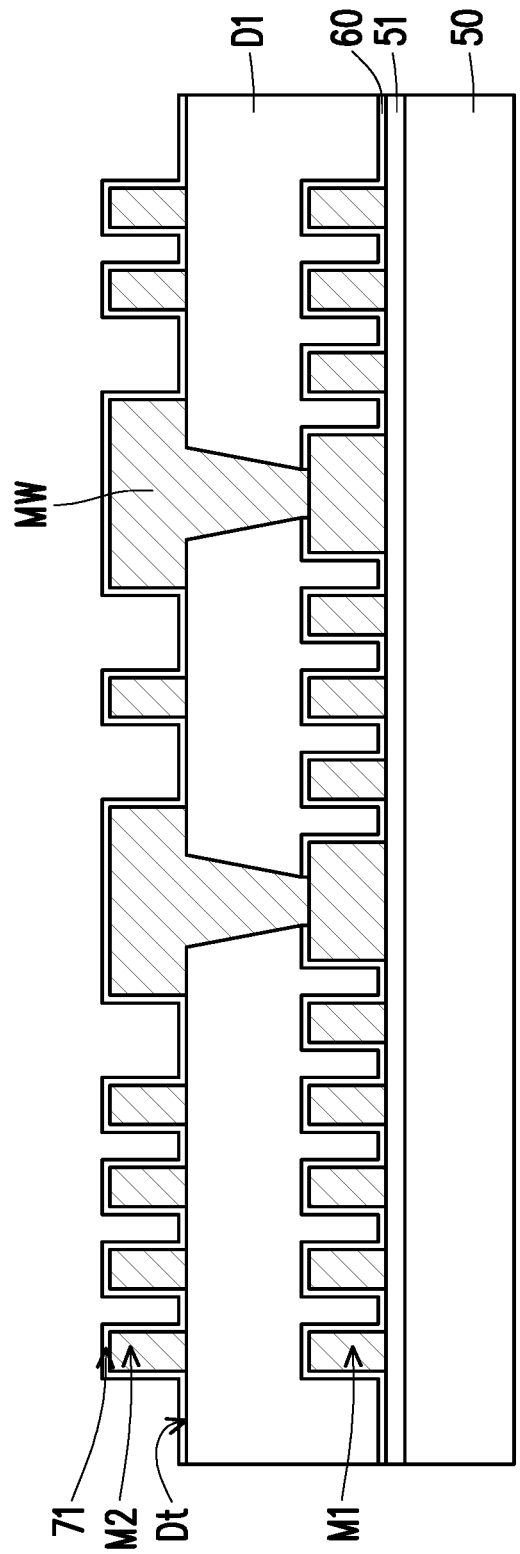

Referring to FIG. 6F, a dielectric liner 71 may be conformally formed on the patterned dielectric layer D1 to cover the conductive pattern M2 at the second level. The material and the formation of the dielectric liner 71 may be the same or similar to those of the dielectric liner 61 described in FIG. 6B, so the detailed descriptions are not repeated. In some embodiments, the dielectric liner 71 covers the top surface Dt of the patterned dielectric layer D1 and the exposed surfaces of the wiring portions MW of the conductive pattern M2 at this stage.

Figure 6G:
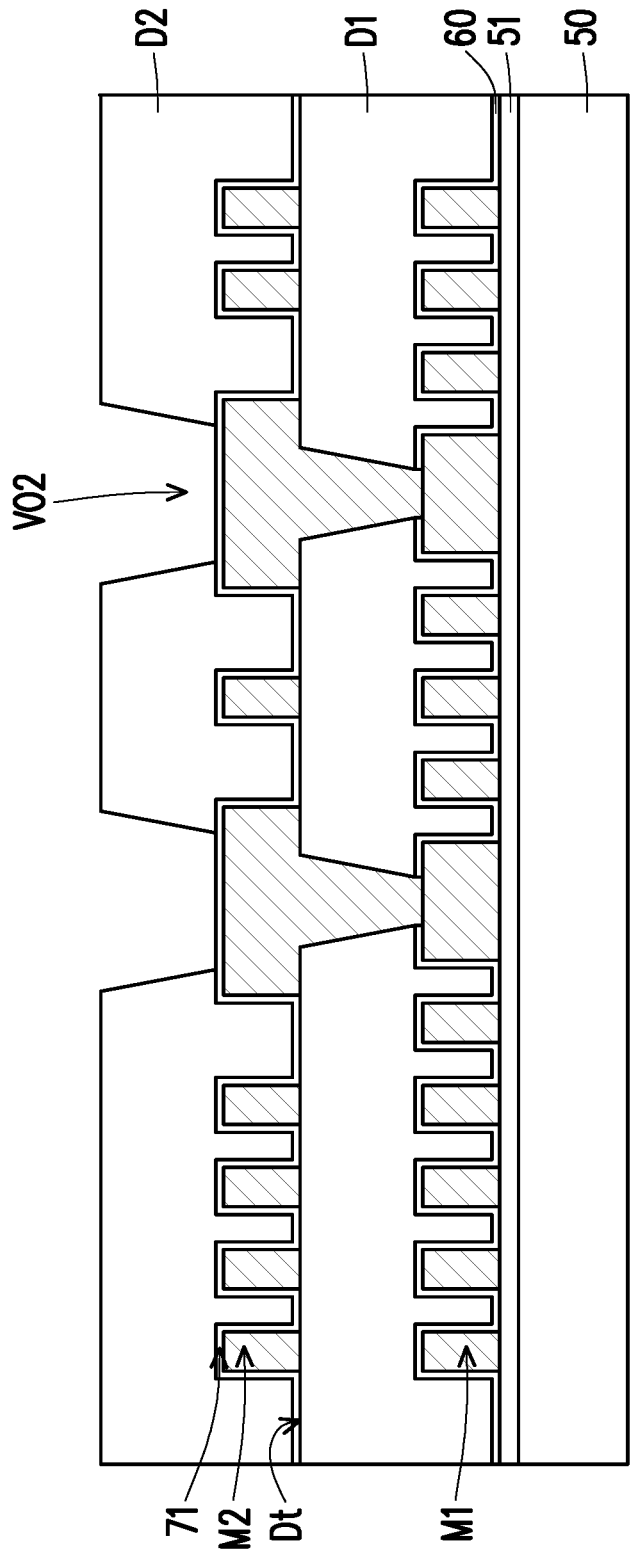

Referring to FIG. 6G, a patterned dielectric layer D2 at the second level may be formed on the patterned dielectric layer D1 at the first level to cover the dielectric liner 71. The patterned dielectric layer D2 may include via openings VO2 exposing at least a portion of the underlying dielectric liner 71 that corresponds to the conductive pattern M2. In some embodiments, the respective via opening VO2 is tarped toward the dielectric liner 71. Alternatively, the inner sidewalls of the patterned dielectric layer D2 that define the via openings VO2 are vertical relative to the top surface of the dielectric liner 71. The material and the formation of the patterned dielectric layer D2 may be the same or similar to those of the patterned dielectric layer D1 described in FIG. 6C, so the detailed descriptions are not repeated.

Figure 6H:
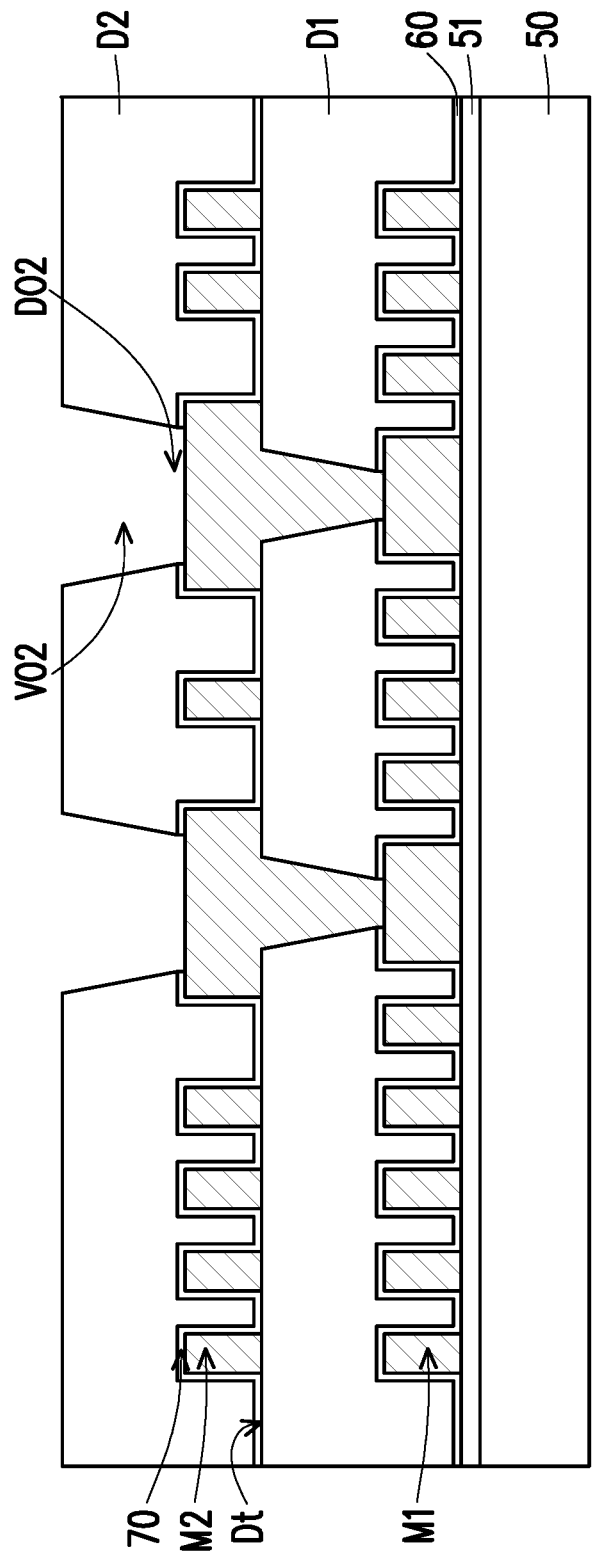

Referring to FIG. 6H, the portion of the dielectric liner 71 which is exposed by the via openings VO2 of the patterned dielectric layer D2 may be removed to form the patterned dielectric liner 70 having openings DO2 exposing the underlying conductive pattern M2 for further electrical connection. That is, a portion of the conductive pattern M2 may be exposed by the via openings VO2 of the patterned dielectric layer D2 and the corresponding openings DO2 of the patterned dielectric liner 70. The formation of the openings DO2 may be the same or similar to that of the openings DO1 described in FIG. 6D, so the detailed descriptions are not repeated. As shown in FIG. 6H, a portion of the patterned dielectric liner 70 is interposed between the adjacent patterned dielectric layers (D1 and D2), and the rest portion of the patterned dielectric liner 70 separates the patterned dielectric layer D2 from the conductive pattern M2. It is noted that two-layered redistribution structure shown herein is for illustrative purpose, more than two or a single circuitry may be possible depending on circuit design. For example, the processes described in FIGS. 6E-6H may be repeated multiple times to form a multi-layered redistribution structure.

Figure 6I:
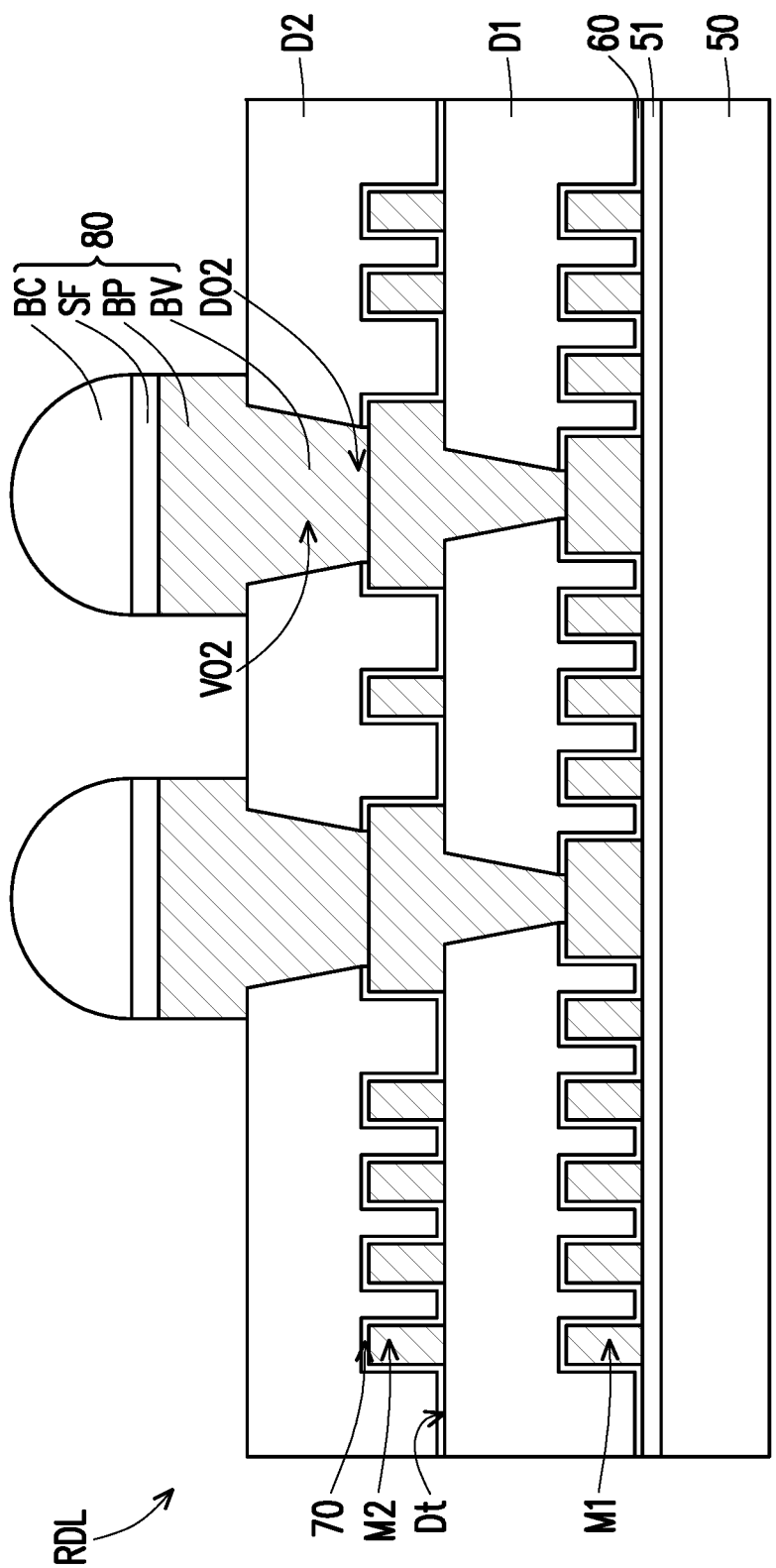

Referring to FIG. 6I, a plurality of conductive terminals 80 may be formed on the conductive pattern M2 for further electrical connection. The conductive terminals 80 may be or may include micro-bumps, Controlled Collapse Chip Connection (C4) bumps, or the like. For example, the respective conductive terminal 80 includes a via portion BV laterally covered by the patterned dielectric layer D2 and the dielectric liner 70 and a bump portion BP disposed on the via portion BV. For example, the via portion BV and the overlying bump portion BP are formed during the same plating step. In other embodiments, the bump portion BP overlying the via portion BV is viewed as the conductive pad. In some embodiments, the respective conductive terminal 80 further includes a cap portion BC formed over the bump portion BP. For example, the cap portions BC are made of solder material and may be formed by a soldering process. A reflow process may be performed to reshape the solder material into a rounded shape.

In some embodiments, before forming the cap portions BC, the surface finishing layer SF may be formed on the bump portions BP to enhance solderability. The surface finishing layer SF may be a single metallic layer or may be a multi-metallic layer structure. The surface finishing layer SF may be or may include nickel, palladium, gold, a combination thereof, or other suitable conductive layer(s), and may be formed by plating or other suitable deposition process. Alternatively, the surface finishing layer SF is omitted. It is noted that the temporary carrier 50 and the release layer 51 are optionally de-bonding to expose the bottom side of the conductive pattern M1 for further electrical connection. The de-bonding process may be similar to the process described in FIG. 1G, so the detailed descriptions are not repeated. Up to here, the fabrication of a redistribution structure RDL is substantially complete.

In some embodiments, the redistribution structure RDL includes the conductive patterns (M1 and M2) which may be viewed as fine circuitries. For example, the line/spacing of the conductive pattern (e.g., M1 and/or M2) ranges from about 0.4 μm/0.4 μm to about 3 μm/3 μm, although lesser and greater line/spacing are also contemplated herein. The manufacturing method of the redistribution structure RDL may be used as the formation of the thin-film redistribution structure 110 described in the preceding paragraphs. In some embodiments, the redistribution structure RDL is formed as a part of the semiconductor die to reroute the electrical signals of the die. In some embodiments, the redistribution structure RDL is formed in a semiconductor package (not shown) to be coupled to a semiconductor die and/or an interposer. For example, the conductive pattern M1 may be physically and electrically connected to the die connectors of the semiconductor die or the connectors of the interposer to achieve reliable I/O interconnections.

Figure 7:
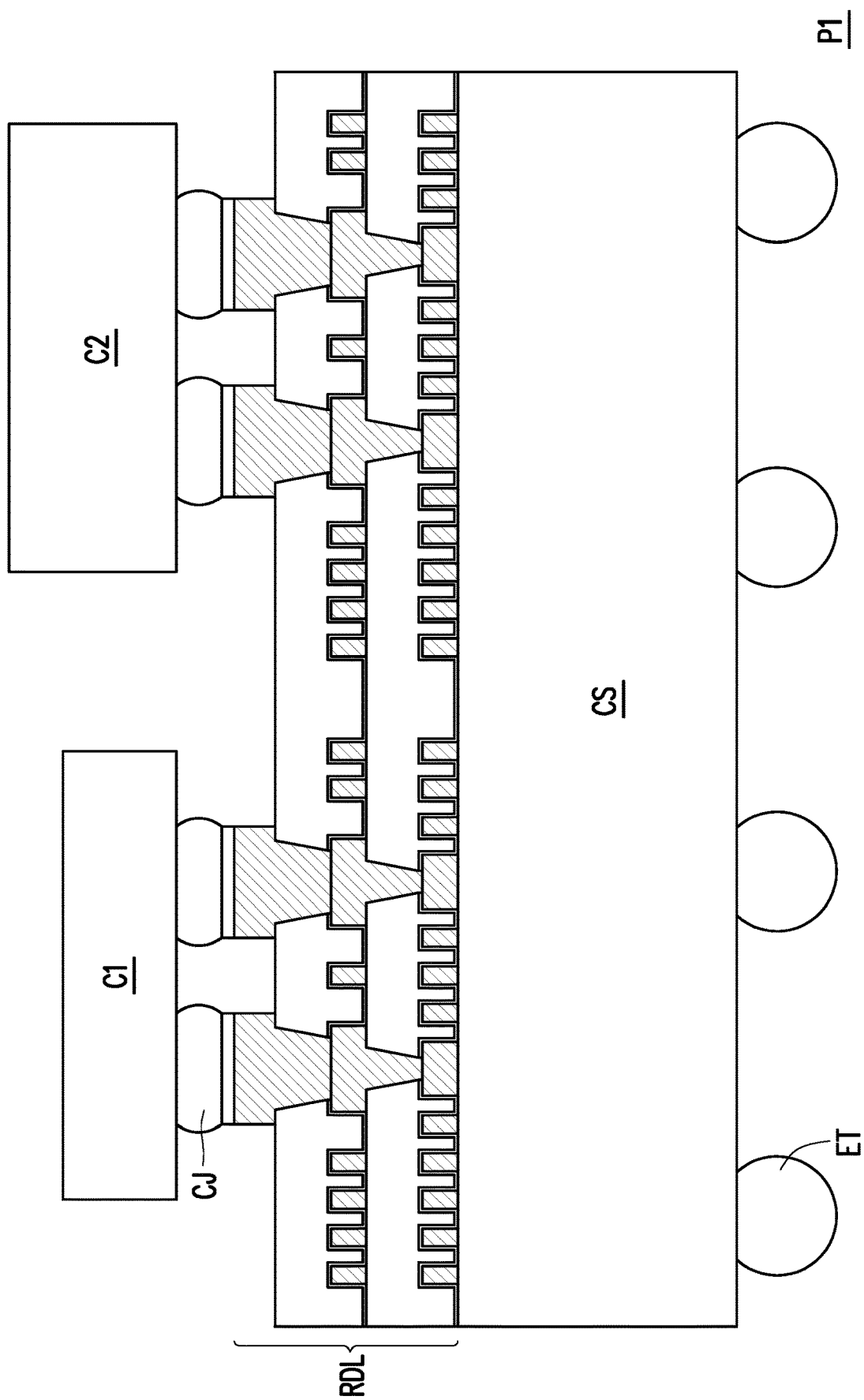
FIG. 7 is a schematic cross-sectional view illustrating a package including a redistribution structure having fine circuitry according to some embodiments.

FIG. 7 is a schematic cross-sectional view illustrating a package including a redistribution structure having fine circuitry according to some embodiments. Referring to FIG. 7 and also with reference to FIG. 6I, a package P1 includes at least one chip (e.g., C1 and C2) coupled to the redistribution structure RDL. The redistribution structure RDL shown in FIG. 7 may be similar to the redistribution structure RDL shown in FIG. 6I, so the detailed descriptions are not repeated. The chips C1 and C2 may be the same type of chip to perform the same function, or may be different types of chips which perform various functions (e.g., logic, memory, optical, RF, etc.) In some embodiments, one of the chips C1 and C2 is a process chip and the other one of the chips C1 and C2 is a high bandwidth memory module. Although other types or other number of chip(s) may be used. The chips C1 and C2 may be physically and electrically connected to the redistribution structure RDL. For example, the chip connectors (not individually shown) of each of the chips C1 and C2 are joined with the conductive terminals 80 of the redistribution structure RDL to form conductive joints CJ between the chips and the fine circuitry. The fine circuitry of the redistribution structure RDL meets the requirements of interconnecting the chips C1 and C2. That is, the chips C1 and C2 may be electrically coupled to each other by the redistribution structure RDL.

In some embodiments, the redistribution structure RDL is formed on a core structure CS. The core structure CS may include or may not include silicon. In some embodiments, the core structure CS is free of silicon and includes polymer layers. The core structure CS may be rigid enough to support the structure thereon. In some embodiments, the core structure CS has wirings (not shown) embedded in the polymer layers for electrically coupling the redistribution structure RDL. The core structure CS may have through vias (not shown) to provide vertical connections between two opposing sides of the core structure CS. In some embodiments, the redistribution structure RDL having fine circuitry is formed on one side of the core structure CS, and the coarse redistribution structure (not shown) is formed on the opposing side of the core structure CS for further electrical connection. For example, external terminals ET (e.g., solder balls, BGA, etc.) may be formed on the core structure CS opposite to the chips C1 and C2. In some embodiments, a conventional interposer is replaced with the redistribution structure RDL. It is noted that the configuration of the package P1 shown in FIG. 7 is only an example, additional or fewer elements may be possible.

Further to that described above, the integrated substrate structure including a circuit substrate and a thin-film redistribution structure coupled to the circuit substrate is provided. The circuit substrate and the thin-film redistribution structure may be connected in various manners. The integrated substrate structure may serve as a space transformer for electrical testing a semiconductor wafer since the integrated substrate structure can meet various pitch requirements of different types of semiconductor wafer. The thin-film redistribution structure may be used to connect fine-pitched testing pads on the semiconductor wafer and the circuit substrate may be used to connect the testing PCB of the signal source carrier. By such configuration, the integrated substrate structure may meet the requirements including reliability, good electrical performance, thinness, stiffness, planarity, competitive unit price for connecting/testing a semiconductor wafer. In addition, the redistribution structure having fine circuitry including a patterned dielectric liner interposed between the adjacent patterned dielectric layers may protect the circuitry during processing. In this manner, a reliable circuitry of the redistribution structure is provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated substrate structure configured to be testable prior to a semiconductor die assembly, comprising:
   a redistribution film comprising a fine redistribution circuitry, wherein the fine redistribution circuitry includes a plurality of conductive pads at a bottom surface of the redistribution film;
   a circuit substrate disposed over the redistribution film and comprising a core layer and a coarse redistribution circuitry disposed in and on the core layer, wherein the circuit substrate is thicker and more rigid than the redistribution film, and a layout density of the fine redistribution circuitry is denser than that of the coarse redistribution circuitry;
   a plurality of conductive features interposed between the circuit substrate and the redistribution film to be connected to the fine redistribution circuitry and the coarse redistribution circuitry;
   a surface finishing layer disposed on the plurality of conductive pads; and
   a plurality of external terminals disposed on and electrically connected to the surface finishing layer,
   wherein the surface finishing layer is placed to avoid oxidation and protect a surface of the plurality of conductive pads, a material of the surface finishing layer includes nickel, palladium, gold, or a combination thereof, and sidewalls of the surface finishing layer are exposed from the redistribution film.

2. The integrated substrate structure according to claim 1, wherein each of the plurality of conductive features comprises a conductive pillar landing on the fine redistribution circuitry and electrically coupled to the coarse redistribution circuitry through a solder joint.

3. The integrated substrate structure according to claim 1, wherein each of the plurality of conductive features is a conductive pad disposed on the fine redistribution circuitry and electrically coupled to a conductive pillar landing on the coarse redistribution circuitry through a solder joint.

4. The integrated substrate structure according to claim 1, wherein each of the plurality of conductive features comprises:
   a conductive pad disposed on the fine redistribution circuitry; and
   a conductive bump disposed on the conductive pad and electrically coupled to the coarse redistribution circuitry through a solder joint.

5. The integrated substrate structure according to claim 4, wherein a metallic junction is formed at an interface between the conductive pad and the conductive bump.

6. The integrated substrate structure according to claim 1, wherein the plurality of conductive features disposed on the fine redistribution circuitry are directly bonded to the coarse redistribution circuitry, and a contact area of the respective conductive feature and the coarse redistribution circuitry is equal to a bonding surface area of the respective conductive feature.

7. The integrated substrate structure according to claim 1, further comprising:
an underfill layer interposed between the circuit substrate and the redistribution film to cover the plurality of conductive features, wherein a boundary of the underfill layer on the redistribution film is substantially leveled with an outer sidewall of the redistribution film.

8. The integrated substrate structure according to claim 1, wherein the redistribution film comprises:
a first conductive pattern;
a first patterned dielectric layer covering the first conductive pattern;
a first dielectric liner interposed between the first conductive pattern and the first patterned dielectric layer and conformally covering the first conductive pattern;
a second conductive pattern disposed on the first patterned dielectric layer and penetrating through the first patterned dielectric layer and the first dielectric liner to land on the first conductive pattern;
a second patterned dielectric layer disposed over the first patterned dielectric layer;
a second dielectric liner conformally formed on the first patterned dielectric layer and interposed between the second conductive pattern and the second patterned dielectric layer to physically separate the second conductive pattern from the second patterned dielectric layer; and
a plurality of second conductive pads disposed on the second patterned dielectric layer and penetrating through the second patterned dielectric layer and the second dielectric liner to land on the second conductive pattern,
wherein the second dielectric liner conformally covers the second conductive pattern and is interposed between the first patterned dielectric layer and the second patterned dielectric layer to entirely separate the first patterned dielectric layer from the second patterned dielectric layer.

9. The integrated substrate structure according to claim 8, wherein materials of the first dielectric liner and the second dielectric liner are different from materials of the first patterned dielectric layer and the second patterned dielectric layer.

10. The integrated substrate structure according to claim 1, wherein the coarse redistribution circuitry includes a plurality of through vias in the core layer, each of the plurality of conductive features is disposed exclusively corresponding to one of the plurality of through vias, and a pitch between the adjacent plurality of conductive features is substantially equal to a pitch between the adjacent plurality of through vias.

* * * * *